(12) United States Patent
Smith

(10) Patent No.: US 6,864,570 B2
(45) Date of Patent: Mar. 8, 2005

(54) METHOD AND APPARATUS FOR FABRICATING SELF-ASSEMBLING MICROSTRUCTURES

(75) Inventor: John Stephen Smith, Berkeley, CA (US)

(73) Assignee: The Regents of The University of California, CA (US)

( * ) Notice: Subject to any disclaimer, the term of this patent is extended or adjusted under 35 U.S.C. 154(b) by 409 days.

(21) Appl. No.: 09/877,640

(22) Filed: Jun. 8, 2001

(65) Prior Publication Data

US 2001/0031514 A1 Oct. 18, 2001

Related U.S. Application Data

(63) Continuation of application No. 09/097,599, filed on Jun. 15, 1998, now abandoned, which is a continuation of application No. 08/480,500, filed on Jun. 7, 1995, now Pat. No. 5,904,545, which is a continuation-in-part of application No. 08/169,298, filed on Dec. 17, 1993, now Pat. No. 5,545,291.

(51) Int. Cl.[7] .............................................. H01L 29/72
(52) U.S. Cl. ...................... 257/703; 257/701; 257/752; 257/786
(58) Field of Search ................................. 257/701, 702, 257/707, 723, 724, 730, 752, 786, E21.705, E25.013

(56) References Cited

U.S. PATENT DOCUMENTS

| 823,955 A | 6/1906 | Meredith |
|---|---|---|
| 1,373,812 A | 4/1921 | Heath |
| 1,375,988 A | 4/1921 | Walker |
| 2,505,927 A | 5/1950 | Woodring |
| 3,080,841 A | 3/1963 | De Nobel |
| 3,083,129 A | 3/1963 | Jones et al. |
| 3,197,682 A | 7/1965 | Klass et al. |

(List continued on next page.)

FOREIGN PATENT DOCUMENTS

| DE | 2704373 A1 | 8/1977 |
|---|---|---|
| EP | 110 285 A2 | 6/1984 |

(List continued on next page.)

OTHER PUBLICATIONS

"Merging Semiconductor Optoelectronics with Silicon Technology", Fang et al., IBM Technical Disclosure, vol. 19, No. 10, Mar. 1977, pp. 3959–3960.*
Cohn et al., "Self–Assembling Electrical Networks: An Application of Micromachining Technology," *Proceedings of the Int. Conf. on Solid State Sensors and Actuators*, San Francisco, CA, Jun. 24–27, 1991, pp. 490–493 (1991).
Huang et al., "electrode design for negative dielectrophoresis," *Meas. Sci. Technol.*, 2:1142–1146 (1991).
Yeh et al., "Fluidic Self–Assembly of Microstructures and its Application to the Integration of GaAs on Si," *Proceedings of Workshop on Micro Electro Mechanical Systems*, Jan. 25–28, 1994, Workshop # 7, pp. 279–284 (1994).
Yeh et al., "Fluidic Slef–Assembly for the Integration of GaAs Light–Emitting Diodes on Si Substrates," *IEEE Photonics Technology Letters*, 6(6):706–708 (1994).

Primary Examiner—Minhloan Tran
Assistant Examiner—Thomas L Dickey
(74) Attorney, Agent, or Firm—Townsend and Townsend and Crew LLP

(57) ABSTRACT

A method and apparatus for assembling microstructures onto a substrate through fluid transport. The microstructures being shaped blocks self-align into recessed regions located on a substrate such that the microstructure becomes integral with the substrate. The improved method includes a step of transferring the shaped blocks into a fluid to create a slurry. Such slurry is then dispensed evenly or circulated over the top surface of a substrate having recessed regions thereon. The microstructure via the shape and fluid tumbles onto the surface of the substrate, self-aligns, and engages into a recessed region.

131 Claims, 12 Drawing Sheets

U.S. PATENT DOCUMENTS

| | | | |
|---|---|---|---|
| 3,301,716 A | 1/1967 | Kleinknecht | |
| 3,330,252 A | 7/1967 | Oberg | |
| 3,369,290 A | 2/1968 | Mayer et al. | |
| 3,399,466 A | 9/1968 | Hartley | |
| 3,414,962 A | 12/1968 | Altamura | |
| 3,439,416 A | 4/1969 | Yando | |
| 3,521,128 A | 7/1970 | Oates | |
| 3,539,468 A | 11/1970 | Wright | |
| 3,582,730 A | 6/1971 | Teston | |
| 3,614,740 A | 10/1971 | Delagi | |
| 3,683,105 A | 8/1972 | Shamash et al. | |
| 3,695,502 A | 10/1972 | Gaiser | |
| 3,714,700 A | 2/1973 | Ehrenfellner | |
| 3,717,381 A | 2/1973 | Hagler | |
| 3,717,801 A | 2/1973 | Silverberg | |
| 3,725,160 A | 4/1973 | Bean et al. | |
| 3,736,651 A | 6/1973 | Law et al. | |
| 3,756,872 A | 9/1973 | Goodman | |
| 3,772,105 A | 11/1973 | Shipley | |
| 3,776,394 A | 12/1973 | Miller | |
| 3,781,975 A | 1/1974 | Ressel et al. | |
| 3,843,756 A | 10/1974 | Talbott et al. | |
| 3,869,787 A | 3/1975 | Umbaugh | |
| 3,870,850 A | 3/1975 | Larionov et al. | |
| 3,896,536 A | 7/1975 | Keller et al. | |
| 3,903,590 A | 9/1975 | Yokogawa | |
| 3,930,295 A | 1/1976 | Rose | |
| 3,961,400 A | 6/1976 | Schmid | |
| 3,961,415 A | 6/1976 | Davis, Jr. | |
| 3,973,987 A | 8/1976 | Hewitt et al. | |
| 3,977,071 A | 8/1976 | Jarman | |
| 3,982,627 A | 9/1976 | Isohata | |
| 3,992,236 A | 11/1976 | Wanesky | |
| 4,017,343 A | 4/1977 | Haas | |
| 4,018,373 A | 4/1977 | Beerwerth et al. | |
| 4,062,462 A | 12/1977 | Hentz et al. | |
| 4,103,064 A | 7/1978 | McAlear et al. | |
| 4,103,073 A | 7/1978 | McAlear et al. | |
| 4,111,294 A | 9/1978 | Carpenter et al. | |
| 4,154,998 A | 5/1979 | Luft et al. | |
| 4,170,021 A | 10/1979 | Du Bois et al. | |
| 4,194,668 A | 3/1980 | Akyurek | |
| 4,242,038 A | 12/1980 | Santini et al. | |
| 4,242,157 A | 12/1980 | Gehle | |
| 4,253,280 A | 3/1981 | Du Bois et al. | |
| 4,278,897 A | 7/1981 | Ohno et al. | |
| 4,289,594 A | 9/1981 | Alpaugh et al. | |
| 4,322,737 A | 3/1982 | Sliwa, Jr. | |
| 4,372,805 A | 2/1983 | Takahashi et al. | |
| 4,384,918 A | 5/1983 | Abe | |
| 4,395,165 A | 7/1983 | DeRobertis et al. | |
| 4,466,181 A | 8/1984 | Takishima | |
| 4,479,849 A | 10/1984 | Frantzen | |
| 4,480,284 A | 10/1984 | Tojo et al. | |
| 4,496,419 A | 1/1985 | Nulman et al. | |
| 4,502,094 A | 2/1985 | Lewin et al. | |
| 4,528,747 A | 7/1985 | Hoffman et al. | |
| 4,542,397 A | 9/1985 | Biegelsen et al. | |
| 4,554,611 A | 11/1985 | Lewin | |
| 4,600,936 A | 7/1986 | Khoury et al. | |
| H208 H * | 2/1987 | Ng et al. | 257/737 |
| 4,659,429 A | 4/1987 | Isaacson et al. | |
| 4,668,333 A | 5/1987 | Tandon et al. | |
| 4,670,770 A * | 6/1987 | Tai | 257/777 |
| 4,670,981 A | 6/1987 | Kubota et al. | |
| 4,690,391 A | 9/1987 | Stoffel et al. | |
| 4,698,663 A | 10/1987 | Sugimoto et al. | |
| 4,709,468 A | 12/1987 | Wilson | |
| 4,710,261 A | 12/1987 | Dennis | |
| 4,724,510 A | 2/1988 | Wicker et al. | |
| 4,733,462 A | 3/1988 | Kawatani | |
| 4,733,632 A | 3/1988 | Ohmi et al. | |
| 4,751,512 A | 6/1988 | Longaker | |
| 4,782,447 A | 11/1988 | Ueno et al. | |
| 4,795,497 A | 1/1989 | McConnell et al. | |
| 4,796,191 A | 1/1989 | Honey et al. | |
| 4,802,951 A | 2/1989 | Clark et al. | |
| 4,811,081 A | 3/1989 | Lyden | |
| 4,818,728 A | 4/1989 | Rai et al. | |
| 4,826,605 A | 5/1989 | Doble et al. | |
| 4,843,035 A | 6/1989 | Takashima | |
| 4,858,072 A | 8/1989 | Chall, Jr. | |
| 4,883,300 A | 11/1989 | Akagawa | |
| 4,907,062 A | 3/1990 | Fukishima | |
| 4,917,123 A | 4/1990 | McConnell et al. | |
| 4,949,148 A | 8/1990 | Bartelink | |
| 4,962,441 A | 10/1990 | Collins | |
| 4,971,920 A | 11/1990 | Miyashita et al. | |
| 4,975,143 A | 12/1990 | Drake et al. | |
| 4,980,017 A | 12/1990 | Kaji et al. | |
| 4,990,462 A | 2/1991 | Sliwa, Jr. | |
| 5,034,802 A | 7/1991 | Liebes, Jr. et al. | |
| 5,055,892 A * | 10/1991 | Gardner et al. | 257/99 |
| 5,063,177 A | 11/1991 | Geller et al. | |
| 5,075,253 A | 12/1991 | Sliwa, Jr. | |
| 5,091,045 A | 2/1992 | Froning et al. | |
| 5,155,895 A | 10/1992 | Jakiela et al. | |
| 5,212,703 A * | 5/1993 | Kahen | 372/46 |
| 5,232,511 A | 8/1993 | Bergman | |
| 5,258,325 A | 11/1993 | Spitzer et al. | |
| 5,355,577 A | 10/1994 | Cohn | |
| 5,376,176 A | 12/1994 | Kuriyama | |
| 5,545,291 A | 8/1996 | Smith et al. | |
| 5,770,884 A * | 6/1998 | Pogge et al. | 257/506 |

FOREIGN PATENT DOCUMENTS

| | | |
|---|---|---|
| EP | 054 899 B1 | 10/1984 |
| EP | 149 317 A2 | 7/1985 |
| EP | 201 240 A1 | 11/1986 |
| EP | 154 431 B1 | 8/1989 |
| EP | 417 851 B1 | 1/1996 |
| EP | 747 948 A3 | 12/1996 |
| EP | 747 948 A2 | 12/1996 |
| FR | 2572849 A1 | 5/1986 |
| GB | 816285 | 7/1959 |
| GB | 2144907 A | 3/1985 |
| JP | 53-132495 A | 11/1978 |
| JP | 56-107563 | 8/1981 |
| JP | 60-017332 | 1/1985 |
| JP | 60-71012 | 4/1985 |
| JP | 60-168574 | 9/1985 |
| JP | 61-054217 | 3/1986 |
| JP | 0639124 | 1/1988 |
| JP | 63-028417 | 2/1988 |
| JP | 63-102738 A | 5/1988 |
| JP | 3-102738 | 4/1991 |
| JP | 05304306 A | 11/1993 |
| JP | 5-304306 | 11/1993 |
| JP | 193866 | 6/2001 |
| WO | WO 79/00510 A1 | 3/1979 |
| WO | WO 94/02395 A1 | 2/1994 |
| WO | WO 95/17005 A1 | 6/1995 |

* cited by examiner

METHOD AND APPARATUS FOR FABRICATING SELF-ASSEMBLING MICROSTRUCTURES

CROSS-REFERENCE

This application is a continuation of U.S. application Ser. No. 09/097,599, filed Jun. 15, 1998, now abandoned, which is a continuation of U.S. application Ser. No. 08/480,500, filed Jun. 7, 1995, now U.S. Pat. No. 5,904,545, which is a continuation-in-part of U.S. application Ser. No. 08/169,298, filed Dec. 17, 1993, now U.S. Pat. No. 5,545,291, the disclosure of which is hereby incorporated in its entirety for all purposes.

This application is related to U.S. application Ser. No. 08/485,478, filed Jun. 7, 1995, now U.S. Pat. No. 5,824,186, which is a continuation-in-part of U.S. application Ser. No. 08/169,298, filed Dec. 7, 1993, now U.S. Pat. No. 5,545,29, the disclosure of which is hereby incorporated in its entirety for all purposes.

This application is also related to U.S. application Ser. No. 08/437,540, filed May 9, 1995, now U.S. Pat. No. 5,783,856, which is a divisional of U.S. application Ser. No, 08/169,298, filed Dec. 7, 1993, now U.S. Pat. No. 5,545.291, the disclosure of which is hereby incorporated in its entirely for all purposes.

GOVERNMENT RIGHTS NOTICE

This invention was made with government support under Grant (Contract) Nos. AFOSR-91-0327 and F49620-92-J-054-1 awarded by the Department of Defense. The Government has certain rights to this invention.

BACKGROUND OF THE INVENTION

The present invention relates to the field of electronic integrated circuits. The invention is illustrated in an example with regard to the manufacture of gallium arsenide microstructures onto a silicon substrate, but it will be recognized that the invention will have a wider range of applicability. Merely by way of example, the invention may be applied in the manufacture of devices containing silicon based electronic devices integrated with a gallium arsenide based microstructures (or devices) such as light emitting diodes (LED), lasers, tunneling transistors, Gunn oscillators, integrated circuits, solar collectors, liquid crystal displays (LCDs), and others.

Industry currently needs a cost effective, efficient, and practical method for assembling a higher cost microstructure onto a lower cost commercially available substrate. In particular, a material such as gallium arsenide possesses substantially better characteristics for some specific electronic and opto-electronic applications rather than materials such as silicon. However, in the fabrication of gallium arsenide devices, substantial regions of a gallium arsenide wafer are typically unused and wasted. Such unused regions generally create an inefficient use of precious die area. In addition, processing gallium arsenide typically requires special techniques, chemicals, and equipment, and is therefore costly.

Other applications such as very large scale integrated (VLSI) circuits may be better fabricated in silicon rather than gallium arsenide. In still further applications, it may be desirable to produce integrated circuits having characteristics of both types of materials. Accordingly, industry needs to develop an effective method of fabricating a gallium arsenide device integrated with a silicon based integrated circuit. The resulting structure of such method includes advantages of both gallium arsenide and silicon based devices.

Methods such as flip chip bonding, lift off methods, and others, generally require large areas of a substrate and are incompatible with a micron sized state-of-art microstructure. Such methods often create difficulty in positioning a particle onto a substrate. Accordingly, industry needs to develop an effective method of fabricating higher cost materials such as a gallium arsenide microstructure onto a lower cost substrate such as silicon.

Industry utilizes or has proposed several methods for fabricating individual electronic components (or generally microstructures) and assembling such structures onto a substrate. One approach is to grow gallium arsenide devices directly onto a silicon substrate. This approach becomes limiting because the lattice structure of gallium arsenide mismatches that of silicon. In addition, growing gallium arsenide onto silicon is inherently difficult and therefore costly. Accordingly, gallium arsenide can not efficiently be grown on a silicon substrate.

Another approach is described by Yando in U.S. Pat. No. 3,439,416. Yando describes components or structures placed, trapped, or vibrated on an array of magnets. Such magnets include magnetized layers alternating with non-magnetized layers to form a laminated structure. Components are matched onto the array of magnets forming an assembly thereof. However, severe limitations exist on the shape, size, and distribution of the components. Component width must match the spacing of the magnetic layers and the distribution of components are constrained by the parallel geometry of lamination. In addition, self-alignment of components requires the presence of the laminated structure. Furthermore, the structures disclosed by Yando typically possess millimeter sized dimensions and are therefore generally incompatible with micron sized integrated circuit structures. Accordingly, the method and structure disclosed by Yando is thereby too large and complicated to be effective for assembling a state-of-art microstructure or component onto a substrate.

Another approach involves mating physical features between a packaged surface mount device and substrate as described in U.S. Pat. No. 5,034,802, Liebes, Jr. et al. The assembly process described requires a human or robotics arm to physically pick, align, and attach a centimeter sized packaged surface mount device onto a substrate. Such process is limiting because of the need for the human or robotics arm. The human or robotics arm assembles each packaged device onto the substrate one-by-one and not simultaneously, thereby limiting the efficiency and effectiveness of the operation. Moreover, the method uses centimeter sized devices (or packed surface mount integrated circuits), and would have little applicability with micron sized integrated circuits in die form.

Another approach, such as the one described in U.S. Pat. No. 4,542,397, Biegelsen et al. involves a method of placing parallelogram shaped structures onto a substrate by mechanical vibration. Alternatively, the method may also employ pulsating air through apertures in the support surface (or substrate). A limitation to the method includes an apparatus capable of vibrating the structures, or an apparatus for pulsating air through the apertures. Moreover, the method described relies upon centimeter-sized dies and would have little applicability with state-of-art micron sized structures.

A further approach such as that described in U.S. Pat. No. 4,194,668 by Akyurek discloses an apparatus for aligning and soldering electrode pedestals onto solderable ohmic anode contacts. The anode contacts are portions of individual semiconductor chips located on a wafer. Assembling the structures requires techniques of sprinkling pedestals onto a mask and then electromagnetic shaking such pedestals for alignment. The method becomes limiting because of the need for a shaking apparatus for the electromagnetic shaking step. In addition, the method also requires a feed surface gently sloping to the mask for transferring electronic pedestals onto the mask. Moreover, the method is solely in context to electrode pedestals and silicon wafers, thereby limiting the use of such method to these structures.

Still another approach requires assembling integrated circuits onto a substrate through electrostatic forces as described in application Ser. No. 07/902,986 filed Jun. 23, 1992 by Cohn. The electrostatic forces vibrate particles such that the particles are arranged at a state of minimum potential energy. A limitation with such method includes providing an apparatus capable of vibrating particles with electrostatic forces. Moreover, the method of Cohn creates damage to a portion of the integrated circuits by mechanically vibrating them against each other and is also generally ineffective. Accordingly the method typically becomes incompatible with a state-of-art microstructure.

From the above it is seen that a method of assembling a microstructure onto a substrate that is compact, low cost, efficient, reliable, and requires little maintenance is desired.

SUMMARY OF THE INVENTION

The present invention pertains to a method and resulting structure for assembling a microstructure onto a substrate. In particular, the method includes transferring shaped blocks or generally structures via a fluid onto a top surface of a substrate having recessed regions or generally binding sites or receptors. Upon transferring, the blocks self-align through their shape into the recessed regions, and integrate thereon. The resulting structure may include a variety of useful electronic integrated circuits containing silicon based electronic devices integrated with a gallium arsenide based microstructures such as a light emitting diodes (LED), lasers, tunneling transistors, Gunn oscillators, integrated circuits, solar collectors, and others. As an additional example, semiconductor devices may be integrated with other semiconductor devices or other substrate materials, such as plastic.

In one specific embodiment, the method provides assembling a microstructure such as a micron sized block onto a substrate. The substrate includes a top surface with at least one recessed region thereon and may be either a silicon wafer, gallium arsenide wafer, glass substrate, ceramic substrate, or others. The substrate may also be a plastic sheet fabricated from a technique such as stamping, injection molding, among others. Assembling steps include providing shaped blocks, and transferring the blocks into a fluid to form a mixture thereof or generally a slurry. Such slurry is then dispensed evenly over the substrate at a rate where at least one of the shaped blocks is disposed into a recessed region. Dispensing occurs at substantially a laminar flow and allows a portion of the shaped blocks to self-align into the recessed region. Alternatively, the method includes circulating the slurry at a rate where at least one of the shaped blocks is disposed into a recessed region. A gas, including but not limited to nitrogen, facilitates circulation of the slurry and allows a portion of the shaped blocks to self-align into the recessed regions.

The invention further provides related apparatus for assembling a microstructure on a substrate with at least one recessed region thereon. The apparatus includes a vessel that contains the substrate, a fluid, and the shaped blocks. The apparatus also includes a pump that circulates the shaped blocks within the vessel at a rate where at least one of the shaped blocks is disposed into a recessed region.

In an alternative embodiment, the method provides, for example, shaped blocks having a trapezoidal profile from an improved fabrication process. Fabrication includes providing a second substrate having a top surface, and growing a sacrificial layer overlying the top surface. A step of forming a block layer overlying the top surface is then performed. Masking and etching the block layer up to the sacrificial layer creates trapezoidal shaped blocks thereon. A step of preferential etching the sacrificial layer lifts off each trapezoidal shaped block. Such blocks are then rinsed and transferred into a solution forming the slurry. In this embodiment, the method provides alternate fabrications of the shaped blocks. One such alternate fabrication of the shaped blocks includes providing a second substrate as a block layer having an upper surface and a bottom surface, and growing a sacrificial layer overlying the upper surface. Another alternative fabrication of the shaped blocks includes providing a second substrate having an upper surface, a sacrificial layer overlying the upper surface, and a block layer overlying the sacrificial layer. After providing the second substrate, a step of forming trapezoidal shaped blocks on and in contact with the sacrificial layer is then performed. The trapezoidal shaped blocks are then removed from contact with the sacrificial layer, and transferred into a fluid to form a slurry.

The invention further provides a resulting trapezoidal shaped block integral with a substrate. The substrate includes a plurality of recessed regions thereon. Each recessed region includes a shaped profile to accept a trapezoidal shaped block. The resulting structure has such blocks integrated with the substrate via the recessed regions forming assembled devices or integrated circuits.

Still a further embodiment, the shaped block comprises a truncated pyramid shaped gallium arsenide structure. The truncated pyramid shaped structure includes a base with four sides protruding therefrom to a larger top surface. Each side creates an angle between about 50° and about 70° from the base to a side. Each side may also have a height between about 5 $\mu$m and about 15 $\mu$m. The block may have a length between about 10 $\mu$m and about 50 $\mu$m, and a width between 10 $\mu$m and about 50 $\mu$m.

The improved method and resulting structure are in context to a trapezoidal shaped block made of gallium arsenide assembled onto a silicon substrate merely for illustrative purposes only. The improved method and related apparatus are in context to different sized trapezoidal shaped blocks made of silicon assembled onto a silicon substrate merely for illustrative purposes. The shaped blocks may also include a cylindrical shape, pyramid shape, rectangular shape, square shape, T-shape, kidney shape, or the like (symmetrical and asymmetrical), and combinations thereof. Generally, the shape of the block allows the block to closely insert into a similarly shaped recessed region or receptor on a substrate. The shaped blocks also comprise a material such as gallium aluminum arsenide, silicon, diamond, germanium, other group III–V and II–VI compounds, multilayered structures, among others. Such multilayered structure may include metals, insulators such as silicon dioxide, silicon nitride, and the like, and combinations thereof.

A further understanding of the nature and advantages of the invention will become apparent by reference to the remaining portions of the specification and drawings.

DESCRIPTION OF SPECIFIC EMBODIMENTS

With reference to FIGS. 1–21, the present invention provides an improved method of fabricating a microstructure onto a substrate, a related apparatus, and an improved resulting structure. FIGS. 1–17 are, for example, in context to fabricating and assembling a shaped gallium arsenide block onto a silicon substrate for illustrative purposes only.

FIGS. 18–21 are, as further examples, in context to fabricating and assembling shaped silicon blocks onto a silicon substrate for illustrative purposes only.

In the assembly of a gallium arsenide block onto a silicon wafer, trapezoidal shaped blocks self-align into inverted trapezoidal shaped recessed regions located on the top surface of the silicon wafer. Steps for such method include forming the gallium arsenide blocks, transferring the blocks into a solution forming a slurry, and spreading the slurry evenly over the top surface of a silicon substrate having recessed regions. During the spreading steps, the blocks self-align and settle into the recessed regions while being transported with the fluid across the top surface. Optionally, the slurry is spread evenly over the top surface of a silicon substrate by way of mechanical means such as a brush, a scraper, tweezers, a pick, a doctor blade, and others. The mechanical means may be used to move or distribute the slurry and also to remove excess slurry. As an alternative to spreading the slurry, the method includes circulating the slurry over the top surface of the substrate having recessed regions. During the circulating step, the blocks self-align and settle into the recessed regions while being transported with the fluid across the top surface. The blocks which do not settle into recessed regions are then recirculated until a certain fill-factor is achieved. Of course, the mechanical means may also be used in conjunction with the circulating step. The details of fabricating the silicon substrate having recessed regions will be discussed in detail below after a brief discussion of forming the gallium arsenide blocks. Details of the method using the circulating step and related apparatus will be discussed in detail below after a discussion of fabricating the silicon substrate having recessed regions.

Figure 1:
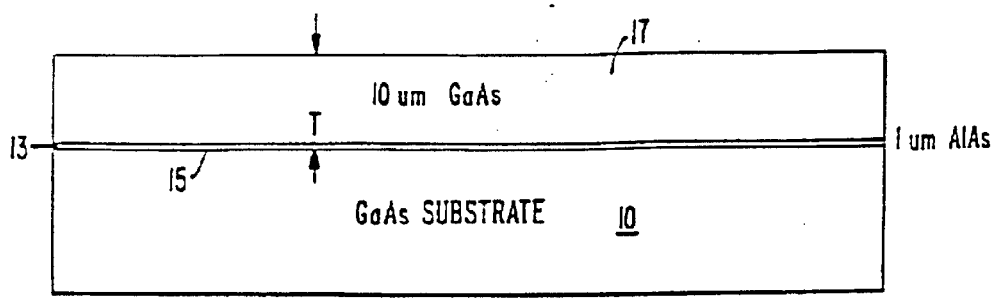
FIG. 1 is a gallium arsenide wafer having a molecular beam epitaxy (MBE) grown gallium arsenide layer for the improved method of fabrication.

In a specific embodiment, the method provides as an example a step of forming trapezoidal shaped blocks from a gallium arsenide wafer. Such step includes providing a gallium arsenide wafer 10 as illustrated in FIG. 1. The method also provides forming sacrificial layer 13 by chemical vapor deposition, sputtering, or the like overlying top surface 15 of gallium arsenide wafer 10. Such sacrificial layer 13 includes, for example, aluminum arsenide. Other sacrificial layers may include indium phosphate, silicon dioxide, photoresist, among other materials capable of being selectively etched. Of course, the sacrificial layer used depends upon the particular application. For an aluminum arsenide sacrificial layer, thickness for such layer is between about 0.1 $\mu$m and about 5.0 $\mu$m, and preferably at about 1 $\mu$m. Before forming sacrificial layer 13, a step of etching top surface 15 by methods such as wet etching, plasma etching, or reactive ion etching clears off any native oxide. Alternatively, a step of desorption in the presence of arsenic removes the native oxide layer. A subsequent step of preferential etching (to be discussed in detail later) removes sacrificial layer 13 to facilitate the lift-off of each gallium arsenide block (also called a mesa shaped or trapezoidal shaped or truncated pyramid shaped structure) formed overlying sacrificial layer 13.

In FIG. 1, gallium arsenide layer 17 forms overlying sacrificial layer 13. Such gallium arsenide layer may be fabricated by methods including molecular beam epitaxy, chemical vapor deposition, and others. The thickness (T) of the gallium arsenide layer is at least about 10 nm and greater, and preferably at about 10 $\mu$m and greater, depending upon the particular application.

Figure 2A:
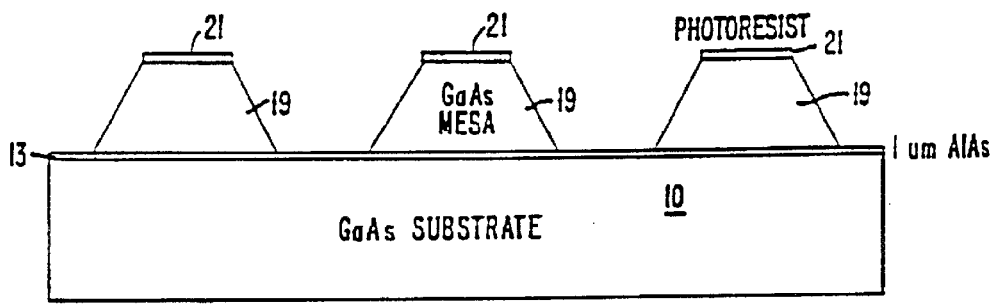
FIG. 2a is an illustration of trapezoidal shaped gallium arsenide blocks etched from an MBE grown gallium arsenide layer.

To produce the desired dimensions for the block, the improved method provides the steps of masking and etching gallium arsenide layer 17. FIG. 2a illustrates gallium arsenide substrate 10 after such masking and etching steps and includes gallium arsenide blocks 19 and a photoresist layer 21 overlying gallium arsenide layer 17 (not shown). Generally, unexposed portions of gallium arsenide layer 17 are etched up to sacrificial layer 13 as illustrated in FIG. 2a. Such etching step provides a plurality of shaped gallium arsenide blocks 19. For the present example, the shaped blocks include a trapezoidal profile or truncated pyramid shape. Such trapezoidal profile may be fabricated by methods of wet etching, plasma etching, ion milling, reactive ion etching, among others, depending on the application.

Generally, a wet etch produces a sloping profile along the sides or edges of each gallium arsenide block. For mask edges parallel to the [1$\bar{1}$0] direction, a wet etch produces an outward sloping profile as illustrated in FIG. 2a. Alternatively, mask edges parallel to the [110] direction, produces an inward sloping (or reverse mesa) profile. The outward sloping profile provides a desired shape which integrates into a silicon substrate having recessed regions shaped in a complementary manner.

Ion milling produces gallium arsenide blocks with outward sloping profiles, depending upon the beam angle. Beam angle is adjusted between about 0° to about 30° from a normal to top surface 15 on gallium arsenide substrate 10. To create the outward sloping (or truncated pyramid shape) profile for each block, the entire structure is typically rotated during such etching step.

Figure 2B:
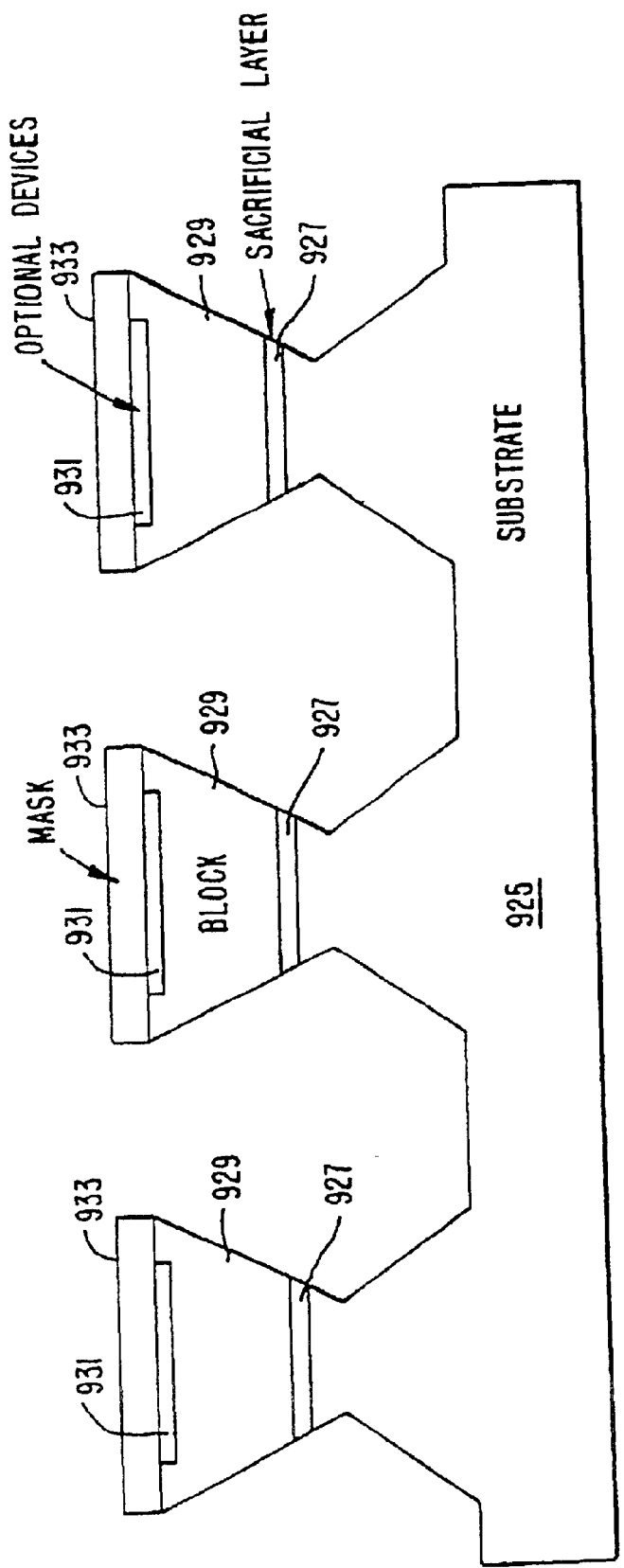
FIG. 2b is an illustration of reverse trapezoidal shaped blocks.

Reactive ion etching (RIE) also produces blocks having a shaped profile in many materials such as gallium arsenide, silicon, or others. In general, a vertical etch may be used at a tilt to cut each sidewall angle. A substantially vertical etch process may also be tuned to undercut at a selected angle without tilting the substrate. In addition, a vertical etch or a reactive ion etch may be used in combination with a wet chemical etch to provide the undercut. Such etching methods create blocks having undercut sides or a reverse mesa profile, as shown in FIG. 2b. FIG. 2b illustrates reverse trapezoidal shaped blocks. FIG. 2b shows substrate 925 (of material such as gallium arsenide, silicon, or the like) after such masking and etching steps and includes shaped blocks 929 on a sacrificial layer 927. A mask layer 933 overlies a device layer 931 which includes electronic or other devices or portions of devices. Generally, unexposed portions of block layer 929 are etched through sacrificial layer 927 as illustrated in FIG. 2b. Depending upon variables such as the etchant, pressure, equipment, and others, such etching method may create blocks having substantially consistent shapes and/or profiles. Vertical etches and wet etches may be used or combined to produce such reverse mesa profiles. A plurality of shaped blocks 929 are thereby produced by removal of the sacrificial layer 927. Removal of the sacrificial layer 927 may be accomplished for example by selective etching, chemical conversion (such as preferentially oxidizing the sacrificial layer, preferentially converting the sacricial layer into porous Silicon, or others) followed by selective etching, thermal or ultrasonic or mechanical fracture, or dissolving, among others, and preferably by selective etching. Alternatively, the functionality of the sacrificial layer 927 may be included in the substrate 925, separating the blocks 929 by removal or etching of substrate 925 in whole or in part.

Figure 3:
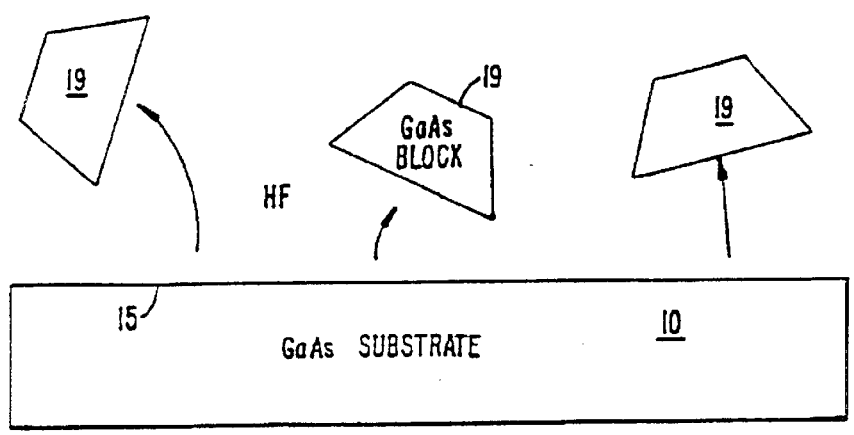
FIG. 3 is an illustration for a lift-off step of gallium arsenide blocks.

In a specific embodiment, after etching the MBE grown layer, trapezoidal shaped blocks are removed through a lift-off technique from gallium arsenide substrate 10 by preferential etching sacrificial layer 13 as illustrated in FIG. 3. Such lift-off technique occurs by, for example, a preferential wet etch of the aluminum arsenide sacrificial layer. In the gallium arsenide example, such wet etching step is typically performed by a chemical such as a hydrofluoric acid solution or the like. The etchant used substantially etches the sacrificial layer but does not aggressively attack gallium arsenide blocks and/or substrates.

After separating the gallium arsenide blocks from substrate 10, methods of diluting and decanting the wet etchant solution remove the blocks from the solution. In the gallium arsenide example, the wet etchant is diluted and decanted using purified water, methanol, ethanol, or the like. Optionally, a rinsing step occurs after the diluting and decanting step. The rinsing step relies on solutions such as acetone, methanol, ethanol, or any other inert solution having low corrosive properties. Such solution also provides a medium (or fluid) for creating a mixture having blocks suspended therein or generally a slurry.

Figure 4:
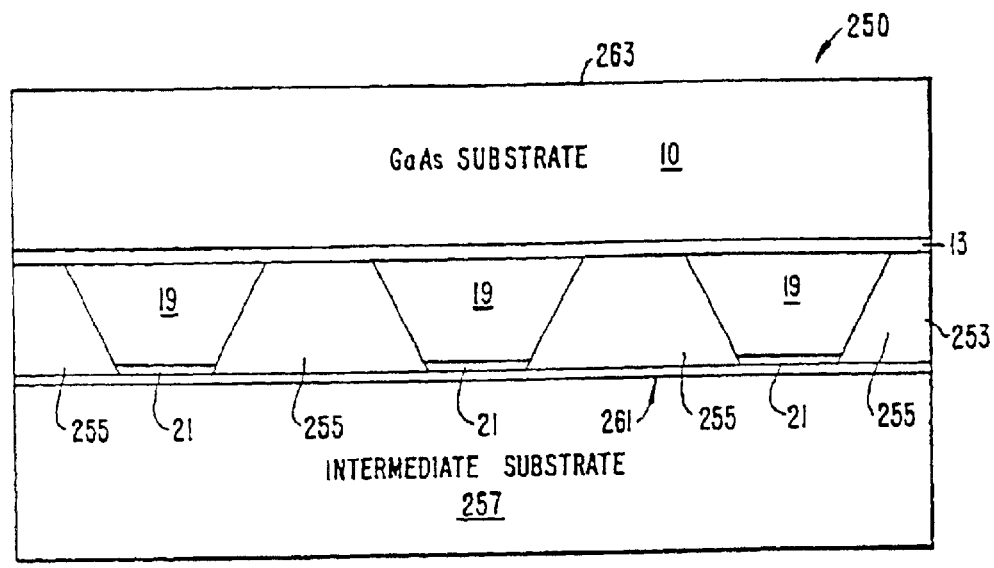
FIG. 4 is an illustration of a portion of an alternative lift-off step using a intermediate substrate.
Figure 5:
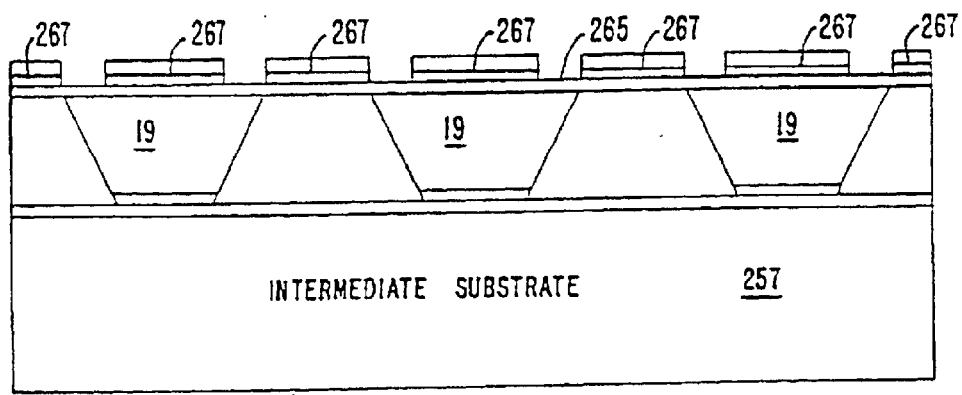
FIG. 5 is an illustration of another portion of the alternative lift-off step of FIG. 4.

Instead of the lift-off technique illustrated in FIG. 3, an alternative lift-off method creates intermediate structure 250 of FIG. 4 from the gallium arsenide structure of FIG. 2a. Such alternative lift-off method also promotes lift-off of the shaped blocks in applications where the devices are formed onto the backside of the blocks. As shown, the method includes spreading a filler or wax layer 253 preferably high temperature wax overlying the top surface of exposed portions of sacrificial layer 13 and gaps 255 between each block 19. One such wax includes a product by the name of TECH WAX made by TRANSENE Co., Inc. The method then includes inverting the gallium arsenide structure of FIG. 2a and attaching top surface 21 onto intermediate substrate 257. Such intermediate substrate is, for example, a silicon wafer or the like. However, prior to the attaching step, intermediate substrate surface 261 undergoes steps of etching off any native oxide preferably with a wet etchant such as hydrofluoric acid, and treating the cleaned surface with an adhesion promoter such as hexamethyldisilazane also called HMDS. In removing gallium arsenide substrate 10, backside 263 is lapped until about 50 $\mu$m remains on substrate 10. The remaining thickness of substrate 10 is then etched up to aluminum arsenide layer 13. An etchant such as ammonium hydroxide and hydrogen peroxide (6:200 $NH_3OH:H_2O_2$) preferentially etches the gallium arsenide substrate up to aluminum arsenide layer 13. Accordingly, the aluminum arsenide layer acts as an etch stop protecting gallium arsenide blocks 19. Removing aluminum arsenide layer 13 requires a step of wet etching using an etchant such as hydrofluoric acid. Such etchant typically removes aluminum arsenide layer 13 after a short dip in such solution. After the aluminum arsenide layer is completely removed, steps including masking, sputtering, and etching form metallized ring contacts 265 as illustrated in FIG. 5. Such metallized ring contacts were made by patterns formed from photoresist layer 267. The metallization for such contacts include materials such as gold, aluminum, among others. Alternatively, other processing steps such as etching, masking, implantation, diffusion, and the like may be performed on the blocks to create other profiles as well as active devices thereon. A solution such as trichloroethane (TCA) dissolves the filler or wax disposed between each block 19 and photoresist layer 21, and lifts off the gallium arsenide blocks 19 from intermediate substrate 257. To decrease corrosion, the gallium arsenide blocks are transferred to an inert solution such as acetone, methanol, ethanol, or any other solution having low corrosive characteristics. Such inert solution and blocks are often called a mixture or generally a slurry.

Figure 18:
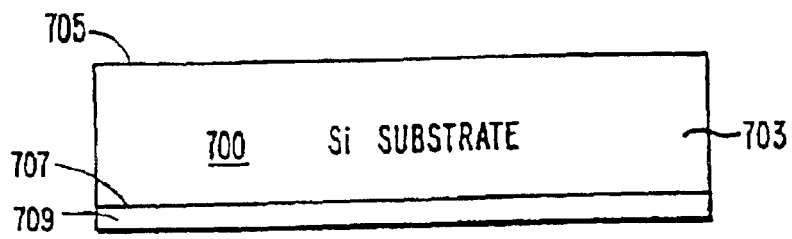
FIG. 18 is a silicon wafer having a deposited silicon nitride layer for an alternate improved method of fabrication of shaped blocks.

In another specific embodiment, the method provides as another example steps of forming trapezoidal shaped blocks from a silicon-type wafer as illustrated in FIG. 18. Such steps include providing a second substrate, such as a silicon wafer 700 defining a block layer 703 with a bottom surface 705 and an upper surface 707. In this embodiment, silicon wafer 700 is a single-side-polished wafer having a dimension of about 2" to about 16" with a thickness of about 10 $\mu$m to about 2000 $\mu$m, and is preferably a two inch silicon wafer of about 235 $\mu$m thickness. Bottom surface 705 is the polished side of silicon wafer 700, and upper surface 707 is the unpolished, rough side. The method also includes forming a sacrificial layer 709 overlying upper surface 707 by a technique such as chemical vapor deposition, sputtering, molecular beam epitaxy, or the like. Sacrificial layer 709 is a layer made of silicon nitride ($SiN_x$), silicon dioxide $SiO_2$, metals, or organics, with a thickness of about 100 Å to about 100 $\mu$m, and is preferably a $SiN_x$ layer of about 0.4 $\mu$m thickness. Similarly to the gallium arsenide block fabrication example, masking and etching steps can be used to form out of block layer 703 the trapezoidal shaped blocks or truncated pyramid shapes. In this embodiment, the trapezoidal shaped block or truncated pyramid shaped structure includes a base with four sides protruding therefrom to a larger top surface. Each side creates an angle between about 20° and about 90° from the top surface to a side, and preferably is about 55°. The block may have a length between about 1 $\mu$m and about 1 cm, and a width between about 1 $\mu$m and about 1 cm, and preferably has a length of about 1.0 mm and a width of about 1.2 mm. The larger face is on and in contact with sacrificial layer 709. A subsequent step of preferential etching removes sacrificial layer 709 to free each trapezoidal shaped block formed overlying sacrificial layer 709. The blocks are then transferred into a fluid to form a slurry containing the larger trapezoidal shaped blocks.

Figure 19:
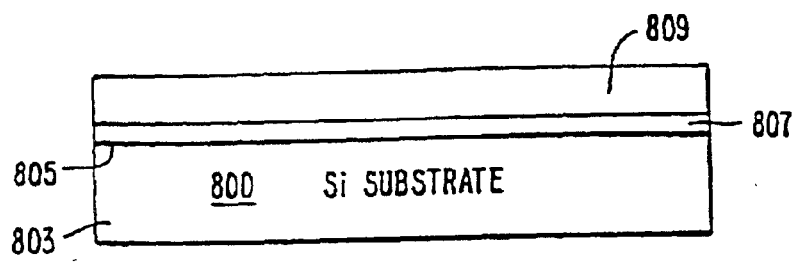
FIG. 19 is a silicon-on-insulator wafer having a silicon-on-insulator layer overlying an insulator layer overlying a silicon substrate for another alternate improved method of fabrication of shaped blocks.

In yet another specific embodiment, the method provides as another example steps of forming trapezoidal shaped blocks from a silicon-on-insulator (SOI) wafer as illustrated in FIG. 19. Such steps include providing a second substrate such as a SOI wafer 800, that defines a silicon substrate 803 with an upper surface 805, a sacrificial layer 807 overlying upper surface 805, and a block layer 809 overlying sacrificial layer 807. Sacrificial layer 807 composed of $SiO_2$ is an insulator layer of SOI wafer 800 and block layer 809 composed of silicon is a silicon-on-insulator layer of SOI wafer 800. In this embodiment, SOI wafer 800 has a silicon-on-insulator layer of a thickness of about 1 $\mu$m to about 2000 $\mu$m, and an insulator layer of thickness of about 100 Å to about 1000 $\mu$m, and preferably has a silicon-on-insulator layer of about 35 $\mu$m thick silicon, and an insulator layer of about 0.4 $\mu$m thick $SiO_2$. Similarly to the other block fabrication examples, masking and etching steps can be used to form out of block layer 809 the trapezoidal shaped blocks on and in contact with sacrificial layer 807.

In this embodiment, the trapezoidal shaped block or truncated pyramid shaped structure includes a base with four sides protruding therefrom to a larger top surface. Each side creates an angle between about 20° and about 90° from the top surface to a side, and preferably is about 55°. The block may have a length between about 1 $\mu$m and about 2000 $\mu$m, and a width between about 1 $\mu$m and about 2000 $\mu$m, and preferably has a length of about 150 $\mu$m and a width of about 150 $\mu$m. As in the silicon example having larger trapezoidal shaped blocks, the larger face of the smaller trapezoidal shaped blocks is in contact with sacrificial layer 807. A subsequent step of preferential etching removes sacrificial layer 807 to free each trapezoidal shaped block formed overlying sacrificial layer 807. Of course, trapezoidal shaped blocks can be removed from contact with the sacrificial layer by steps such as preferential etching, ion milling, or dissolving the sacrificial layer. The blocks are then transferred into a fluid to form a slurry.

Figure 20:
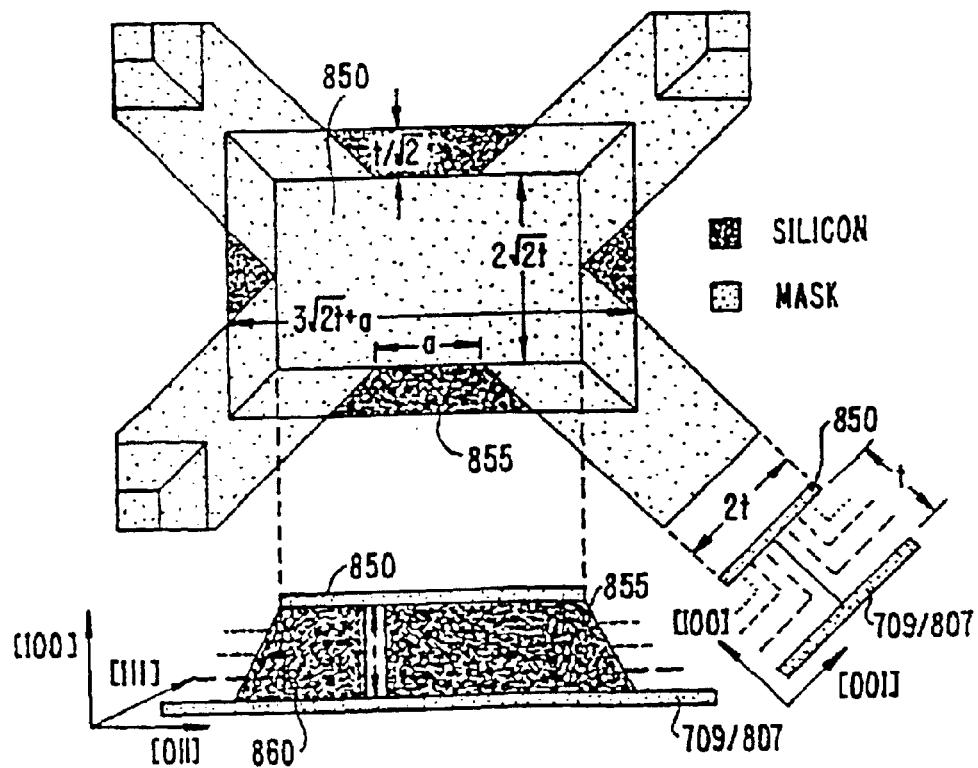
FIG. 20 is an illustration of a mask used to fabricate silicon shaped blocks.

In the two preceding examples of forming trapezoidal shaped blocks from silicon, the slowest etching planes for silicon in the $KOH:H_2O$ etching solution used are the {111} planes, which can be considered etch stops forming the sloping sides of the shaped blocks. In each silicon example, the respective mask used to define the blocks must be aligned to the appropriate crystal axis. As shown in FIG. 20, a mask 850 was used to form the silicon trapezoidal blocks 855. Silicon trapezoidal shaped block 855 is formed at the intersection of the diagonal lines on mask 850, and the larger face 860 of silicon trapezoidal shaped block 855 is in contact with sacrificial layer (respectively 709 and 807, for the first and second preceding silicon examples). The width of the diagonal mask lines in FIG. 20 must be twice the thickness (t) of silicon block layer. For the larger silicon trapezoidal blocks, a=0.2 mm and silicon block layer 703 has t=235 $\mu$m; whereas, for the smaller silicon trapezoidal blocks, a=0 and silicon block layer 809 has t=35 $\mu$m.

For each preceding silicon example, etching is completed when silicon block layer 703 or 809 is etched entirely through, and simultaneously when the corners are precisely formed. Continuing etching beyond this point does not change the overall dimensions of the trapezoidal shaped block, but merely rounds the corners. Because of geometric considerations, the width of the top face of the shaped block must be at least $3\sqrt{2}$ times the thickness of the silicon block layer. This limits the aspect ratio of the blocks fabricated by this technique. This mask pattern utilizes as high as 50% of the silicon area if there is no distance between block corners.

In the first silicon example with the larger shaped blocks, the etched silicon wafer is placed in concentrated HF etch solution to remove the shaped blocks from contact with the $SiN_x$ sacrificial layer and any remaining $SiN_x$ from the mask layer. In the second silicon example with the smaller shaped blocks, the etched SOI wafer similarly is placed in concentrated HF etch solution to remove the shaped blocks from contact with the $SiO_2$ sacrificial layer and any remaining $SiN_x$ from the mask layer. This HF etch solution preferentially etches the $SiO_2$ and the SiNx to free the shaped blocks without etching the silicon shaped blocks. In particular, a HF solution having a concentration of about 1:1 $HF:H_2O$ was used to etch the sacrificial layer and residual SiNx to free the shaped blocks.

Figure 6:
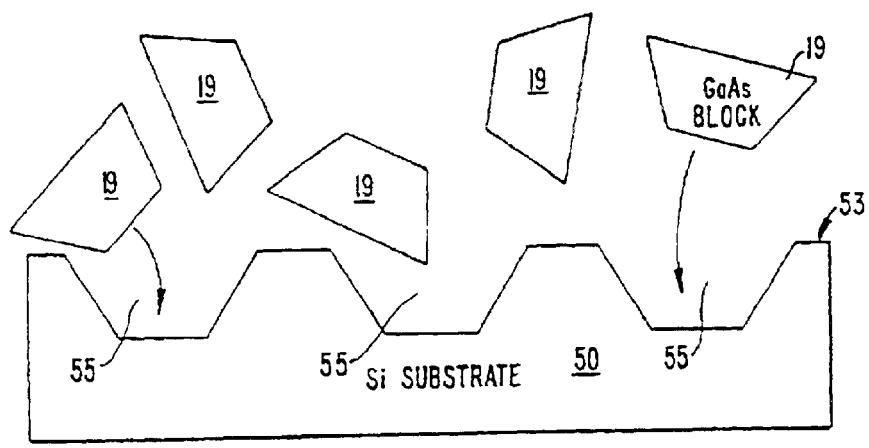
FIG. 6 is an illustration of each gallium arsenide block self-aligning onto a silicon substrate.

The slurry comprises an inert solution (of fluid) and shaped blocks. Enough solution exists in the slurry to allow the blocks to slide across the top surface of the substrate. Preferably, the amount of solution in the mixture is at least the same order as the amount of blocks. Of course, the amount of solution necessary depends upon characteristics such as block size, block material, substrate size, substrate material, and solution. After preparation, the slurry is transferred or spread over top surface 53 of silicon substrate 50 as illustrated in FIG. 6. The details of the transferring technique are discussed below after a brief discussion in fabricating silicon substrate 50.

As shown in FIG. 6, silicon substrate 50 comprises etched recessed regions 55. A variety of techniques including wet etching, plasma etching, reactive ion etching, ion milling, among others provide recessed regions 50, or generally trenches, receptors, or binding sites. Such techniques etch recessed regions 50 with a geometric profile which is complementary to block 19. In the silicon substrate, for example, each recessed region includes a trapezoidal profile or inverted truncated pyramid shape. The trapezoidal profile allows block 19 to self-align and fit closely into recessed region 50 via the improved transferring technique.

The transferring technique includes a step of evenly spreading or pouring the slurry over top surface 53. The transferring technique may be accomplished by pouring a vessel of slurry evenly over top surface 53. Alternatively, the slurry may also be transferred from a pipet, flask, beaker, or any other type of vessel and/or apparatus capable of evenly transferring the slurry over top surface 53. Generally, the slurry is poured over top surface 50 at a rate which allows substantial coverage of the top surface, but prevents blocks already disposed into the recessed regions from floating or popping out. Slurry flow is typically laminar but can be non-laminar, depending upon the particular application. In the gallium arsenide block example, the fluid flux over top surface 53 occurs at a velocity between about 0.01 mm/sec. and about 100 mm/sec. Preferably, fluid flux occurs at about 1 mm/sec. At such flux rates, the blocks flow evenly with the fluid, tumble onto top surface 53, self-align, and settle into recessed regions 55. Optionally, to prevent the blocks already disposed in the recessed regions from floating out, the transferring step may take place in a centrifuge or the like. A centrifuge, for example, places a force on the blocks already disposed in the recessed regions and thereby prevents such blocks from floating out with solution.

Alternatively, the transferring technique may be accomplished by a method and related apparatus that includes circulating the slurry over top surface at a rate which allows blocks to dispose into the recessed regions. The rate may be adjusted to permit the blocks to fill the recessed regions so a desired fill-factor is achieved. The slurry is recirculated at a rate so that blocks which are not already disposed continuously flow across top surface until a certain fill-factor is attained. Optimally, the slurry is recirculated at a rate which does not disturb blocks already disposed into recessed regions.

The circulation rate is adjustable to accomodate a desired fill-factor, which will vary depending on the size of the blocks, number of recessed regions, and the specific application. Some applications require the integration of silicon circuits onto transparent substrates such as glass or plastic for use in an active matrix flat panel display. Each pixel or pixel element would have a small corresponding circuit assembled by the method. Larger circuits could also be assembled, such as for multichip modules which might require a number of different larger circuits on the same substrate. Each of these circuits could be etched to a specific shape and assembled by the method into matching recessed regions. Different applications can also require different fill-factors. For example, multichip modules could tolerate lower fill-factors than flat panel displays, because of the difference in number of components. The method and apparatus of the present invention exhibit high fill-factors for different sizes of shaped blocks. After the shaped blocks have been assembled onto the substrate, the disposed blocks can then be bonded and planarized, or the like, if necessary.

In order to continuously flow shaped blocks across the substrate, an apparatus circulates the slurry containing the shaped blocks across the substrate. The shaped blocks and fluid circulate within the apparatus and generally tumble onto the top surface of the substrate which is also contained in the apparatus. The shaped blocks self-align and engage with a recessed region having a complementary shape. The shaped blocks which are not disposed into recessed regions flow off the substrate and enter the recirculation path of the apparatus to flow over the substrate for disposition into recessed regions until a certain fill-factor is achieved.

Figure 21:
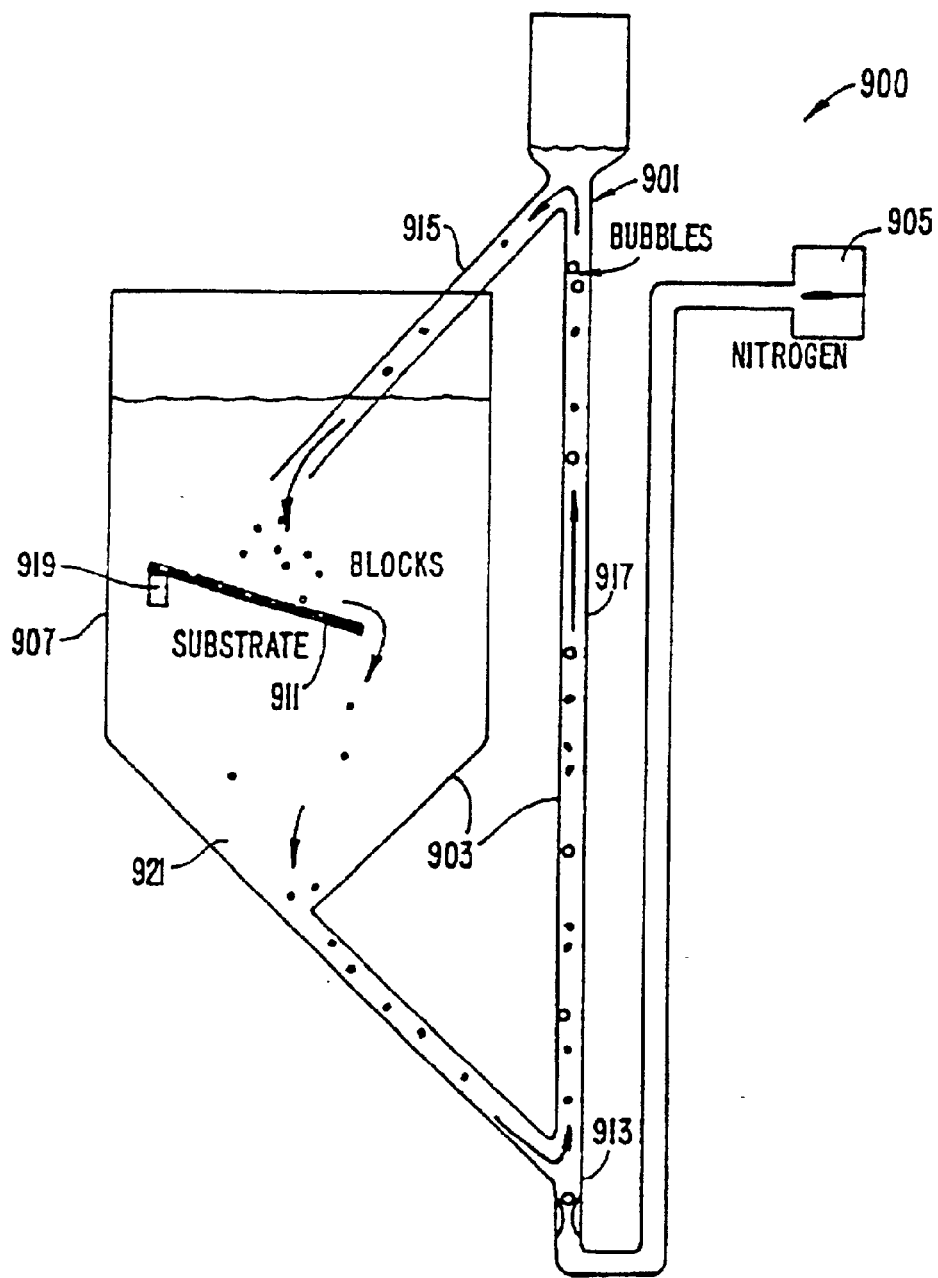
FIG. 21 is an illustration of an apparatus for assembling microstructures onto a substrate.

As illustrated in FIG. 21, an apparatus 900 includes a vessel 903 and a pump 905. In this particular embodiment, apparatus 900 was made entirely of glass but may be constructed of other suitable materials. Vessel 903 includes a receptacle 907 and a conduit 909. Vessel 903 contains a substrate 911 having recessed regions and the mixture of fluid and shaped blocks. Conduit 909, coupled to receptacle 907 which contains substrate 911, includes an input 913, an output 915 leading back to receptacle 907, and a column 917 coupled at one end to input 913 and at the other end to output 915. Pump 905 is coupled to input 913 and dispenses a gas into conduit 909 to facilitate circulation of the fluid and shaped blocks over substrate 911 at a rate where at least one shaped block is disposed into a recessed region.

Receptacle 907 includes a holder 919 and a funneled bottom 921. Holder 919 secures substrate 911 and is capable of moving substrate 911 to facilitate the filling of the recessed regions. Additionally, holder 919 agitates or orients substrate 911 so that shaped blocks not disposed in recessed regions can flow off substrate 911 and back into a recirculation path in vessel 903. The bottom of receptacle 907 is funneled to cause the shaped blocks not disposed into recessed regions on substrate 911 to fall to the bottom of receptacle 907 for recirculation through vessel 903. Shaped blocks not disposed into recessed regions then recirculate through vessel 903.

More specifically, funneled bottom 921 is coupled to input 913 of conduit 909. Shaped blocks not disposed into recessed regions tumble to funneled bottom 921 to input 913 of conduit 909, where pump 905 dispenses a gas, such as nitrogen. The injected gas forms bubbles within the fluid inside column 917 of conduit 909. A gas bubble transports a portion of the fluid and at least one shaped block funneled to input 913 through column 917 back to receptacle 907 through output 915 for attempted disposition into a recessed region. The gas bubble rises through column 917 and transports the fluid and the shaped block to output 915 leading back to receptacle 907.

In this embodiment, apparatus 900 uses nitrogen bubbles to circulate the fluid and the shaped blocks over substrate 911 without damaging the shaped blocks. Depending on, among other factors, the material of the shaped blocks and the fluid used, apparatus 900 may use other media, or gases such as air, hydrogen ($H_2$), nitrogen ($N_2$), oxygen ($O_2$), or argon (Ar) which do not damage the blocks or otherwise react with the flu at which pump 905 dispenses the gas or transport medium can be changed to achieve different fill-factors of the recessed regions.

Figure 7:
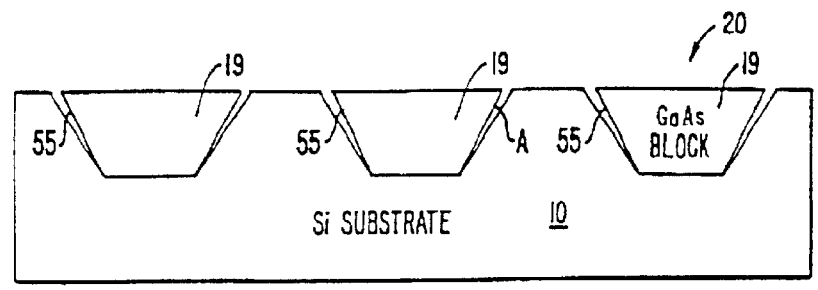
FIG. 7 is an embodiment of a microstructure assembled onto the silicon substrate according to the improved method depicted by FIGS. 1–3 and 6.

In a specific embodiment, the resulting structure 20 of the method described by FIGS. 1–3 and 6 is illustrated in FIG. 7. The assembled microstructure includes silicon substrate 10, gallium arsenide blocks 19, and recessed regions 55. The trapezoidal shape of the blocks and recessed regions allows a block to self-align and fit closely into a recessed region during the transferring step. An angle (A) formed between one side of the block and the corresponding side of the recessed region is between about substantially 0° to about 20°. Preferably, such angle is less than about 5° but greater than substantially 0°. Such angle facilitates the self-alignment process of each block. The improved method allows for the fabrication of multiple blocks or microstructures onto a substrate by various shaped blocks and recessed region geometries and the fluid transferring step.

Figure 8:
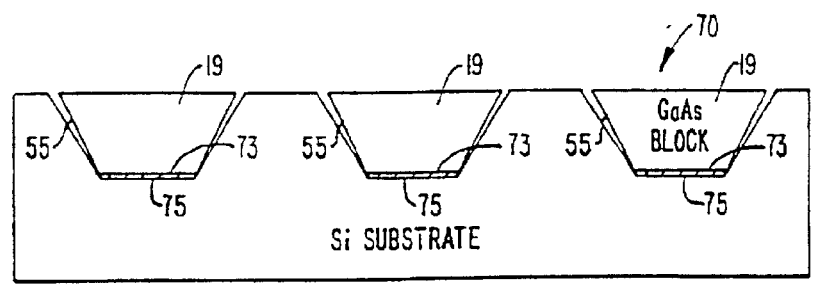
FIG. 8 is an alternative embodiment of a microstructure assembled onto a substrate.

In a modification to the preceding specific embodiment, the blocks 19 are attached into recessed regions 55 through eutectic layer 75 as represented in structure 70 of FIG. 8.

Prior to the lift-off step, a metallized layer such as gold, silver, solder, or the like is formed onto surface 73. Alternatively, the layer attaching the block with each recessed region may be a synthetic adhesive or the like instead of a eutectic layer. Process steps comprising masking, etching, and sputtering typically form such metallized layer. Subsequent to the transferring step, heating structure 70 forms eutectic layer 75 between metallization layer 73 and silicon substrate 10. The eutectic layer provides both mechanical and electrical contact between substrate 10 and block 19. The method of attaching the blocks onto the substrate provides an efficient, cost effective, and easy technique.

Figure 9:
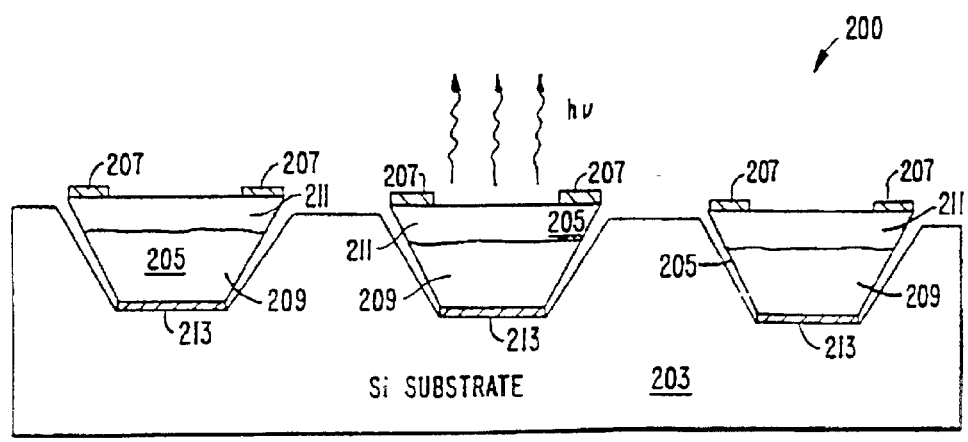
FIG. 9 is an embodiment of a microstructure assembled onto a substrate forming a gallium arsenide diode.

In an alternative specific embodiment, the portions of the improved method of FIGS. 1, 2, 4, 5, and 6 provides the resulting gallium arsenide light emitting diodes (LED) 200 as illustrated in FIG. 9. As shown, the gallium arsenide LED includes silicon substrate 203 and gallium arsenide block 205. Each gallium arsenide block includes at least metallized ring contacts 207, p-type gallium arsenide layer 209, n-type gallium arsenide layer 211, and eutectic layer 213. To illuminate the device, voltage is applied to metallized ring contact 207 or metallization layer. Photons (hv) are illuminated from a center region within each metallized ring contact 207 of gallium arsenide block 205 as shown.

Figure 10:
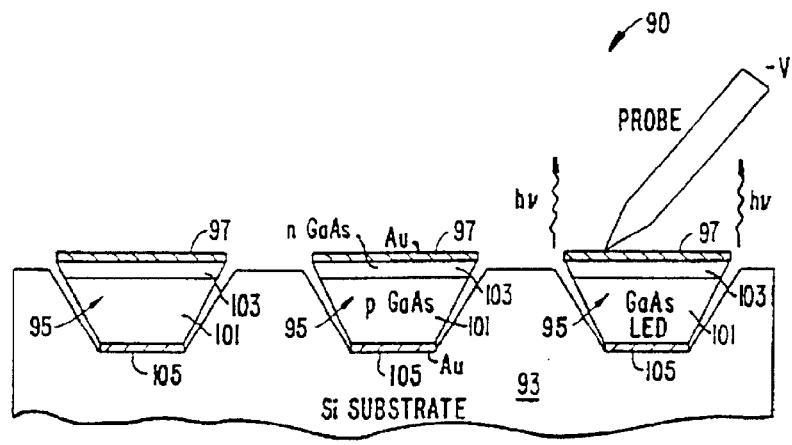
FIG. 10 is an alternative embodiment of a microstructure assembled onto a substrate forming a gallium arsenide diode.

In a further alternative specific embodiment, the improved structure forms gallium arsenide light emitting diodes (LED) 90 as depicted in FIG. 10. Like the previous embodiment, the gallium arsenide LED includes silicon substrate 93 and gallium arsenide block 95. Each gallium arsenide block also includes at least metallized surface 97, p-type gallium arsenide layer 101, n-type gallium arsenide layer 103, and eutectic layer 105, similar to the preceding embodiment. To illuminate the device, voltage is applied to metallization layer 97 by, for example, a probe. Photons (hv) are illuminated from an edge region instead of a center region of gallium arsenide block 95 as shown.

Figure 11:
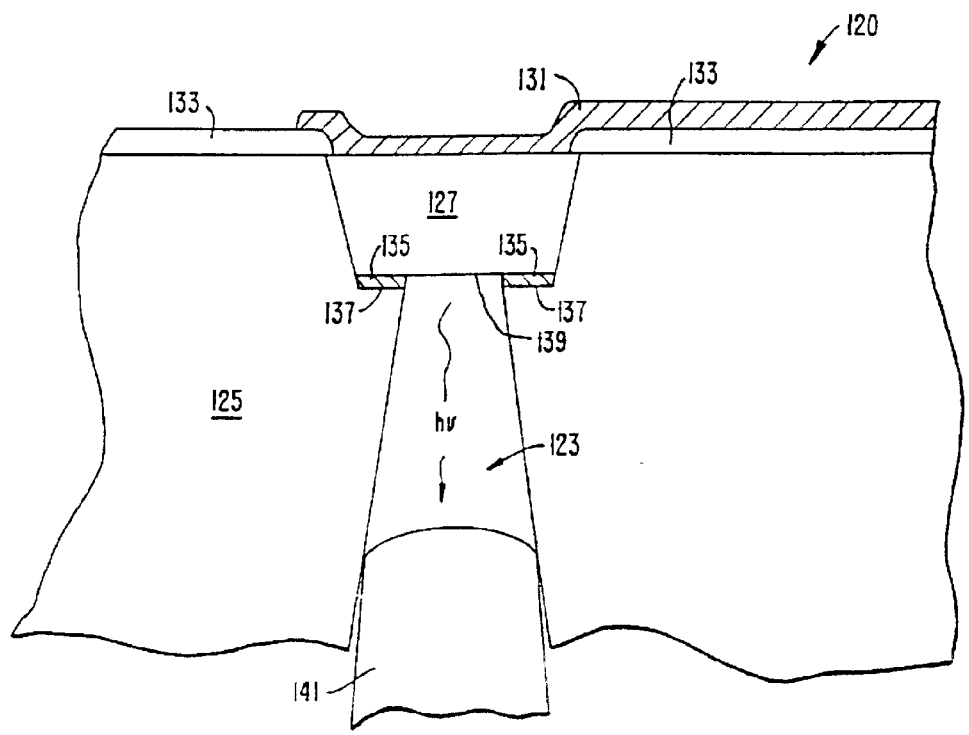
FIG. 11 is a further alternative embodiment of a microstructure assembled onto a substrate forming a gallium arsenide diode.

Still in another specific embodiment, the improved structure forms gallium arsenide structure 120 having tapered aperture opening 123 as illustrated in FIG. 11 (not to scale). A process step such as wet etching, ion milling, reactive ion etching, and others forms the tapered aperture opening 123. The gallium arsenide structure may be an LED, laser, or the like. Similar to the previous embodiment, gallium arsenide structure 120 includes substrate 125 and gallium arsenide block 127. Structure 120 also includes a top metallization layer 131 such as aluminum overlying gallium arsenide block 127 and an insulating layer 133. A ring contact layer 135 provides mechanical and electrical contact between substrate 125 and gallium arsenide block 127. Mechanical support and electrical contact for the gallium arsenide block comes from ledge 137. Also shown is a light emitting (or lasing) aperture 139 having a dimension between about 5 $\mu$m and about 40 $\mu$m. To turn-on the device, voltage is applied to metallization layer 131. Photons (hv) illuminate from gallium arsenide block 127, through light emitting aperture 139, and through tapered aperture opening 123 as shown. Fiber optic cable 141 receives the photons.

Figure 12:
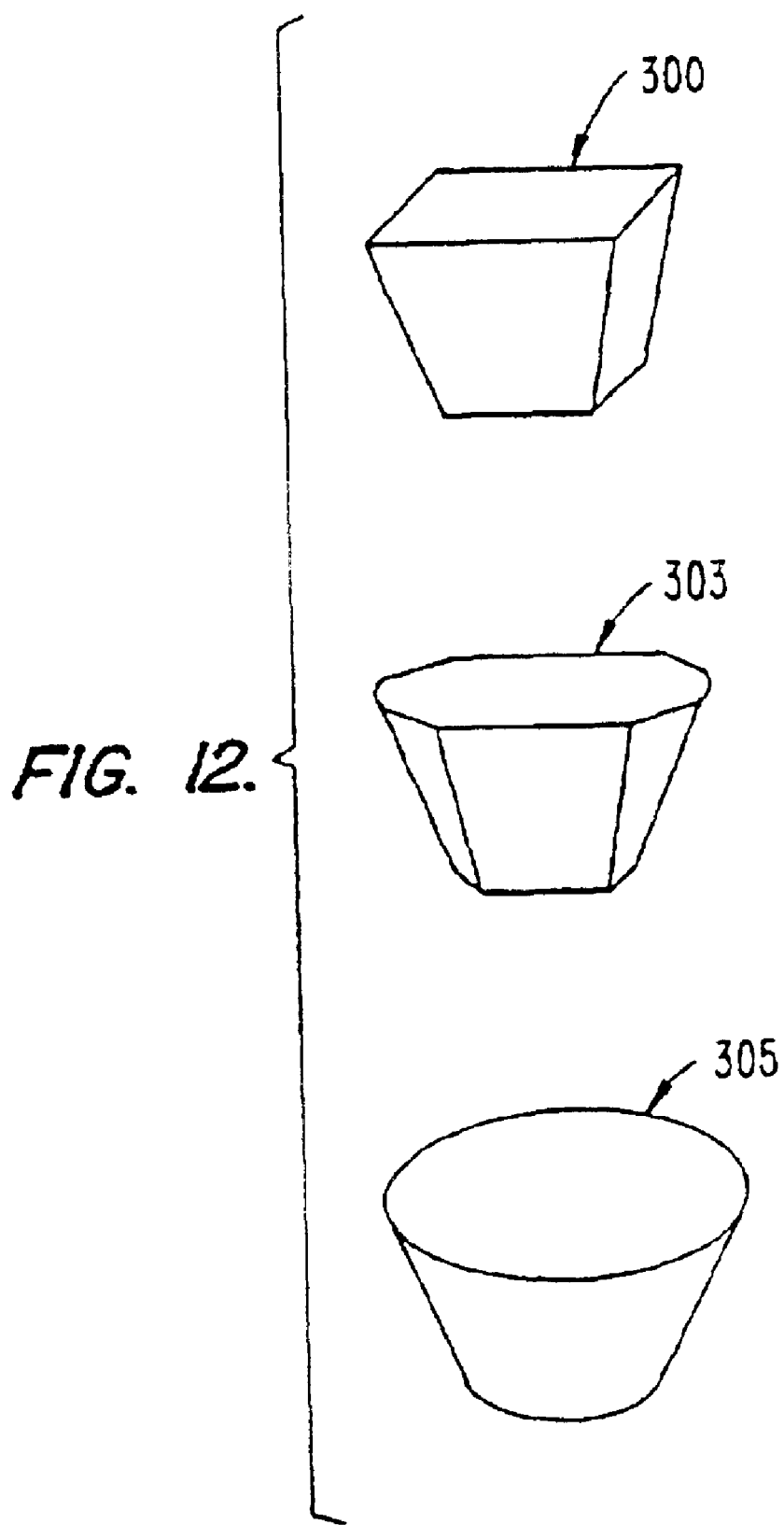
FIG. 12 is an illustration of examples of shaped blocks.

The improved method and resulting structure are in context to a trapezoidal shaped block made of gallium arsenide or silicon merely for illustrative purposes only. Alternatively, the improved method and structure can be in context to almost any block having shaped features. Shaped features allow such blocks to move over the surface of the substrate via fluid transport, align with a corresponding recessed region, and insert into such recessed region. FIG. 12 illustrates further examples of the shaped blocks. As shown, the blocks may, for example, include a rectangular shape 300, octagonal shape 303, or circular shape 305. The rectangular shaped block includes up to four orientations for insertion into a substrate having a corresponding recessed region. Alternatively, the octagonal shaped block includes up to eight orientations and the circular shaped block includes continuous orientations as long as the narrow end inserts first into the recessed region. Such blocks may also comprise a material such as silicon, gallium arsenide, aluminum gallium arsenide, diamond, germanium, other group III–V and II–VI compounds, multilayered structures, among others. Such multilayered structures may include metals, insulators such as silicon dioxide, silicon nitride and the like, and combinations thereof. Generally, the block can be made of almost any type of material capable of forming shaped features. Typically, such blocks are fabricated by methods including ion milling, reactive ion etching, and the like. In facilitating alignment of each block onto a recessed region, an angle between a side of the block and the corresponding side of the recessed region for a disposed block is between about substantially 0° to about 20°. Preferably, such angle is less than about 5° but greater than substantially 0°.

The shaped block assembles with a substrate such as a silicon wafer, plastic sheet, gallium arsenide wafer, glass substrate, ceramic substrate, or the like. The substrate includes almost any type of material capable of forming shaped recessed regions or generally binding sites or receptors thereon which complement the shaped blocks.

EXAMPLES

To prove the principle and demonstrate the operation of the method and structure, a gallium arsenide block in the form of a diode was assembled onto a silicon substrate and operated.

In a gallium arsenide example, a slurry including gallium arsenide blocks were transferred such that the blocks self-aligned into recessed regions located on a top surface of a silicon substrate. The steps for such method included forming the gallium arsenide blocks, transferring the blocks into a solution forming a slurry, and transporting the slurry evenly over a top surface of a silicon substrate having recessed regions. The shaped blocks generally tumble onto the top surface of the substrate, self-align and engage with a recessed region having a complementary shape.

In creating the silicon substrate, a solution of ethylenediamine pyrocatechol pyrazine (EDP) or potassium hydroxide (KOH) produced recessed regions having a trapezoidal profile or inverted truncated pyramid shape. Each solution created trapezoidal shaped profiles having an outward slope of about 55° from an angle normal to the top surface of the substrate. Trapezoidal profiles occurred due to the selectivity (1:100) between the {111} plane and the {100} or {110} plane. Specifically, the {111} plane etched slower than the {100} or {110} plane by a ratio of 1:100.

In the present example, an EDP solution etched recessed regions into a silicon substrate. EDP includes ethylenediamine (about 500 ml.), pyrocatechol (about 160 gms.), water (about 160 gms.), pyrazine (about 1 gm.). The EDP bath was also at a temperature of about 115° C. Prior to the etching step, a thermal oxide ($SiO_2$) layer having a thickness of about 200 nm was first formed on a top surface of such substrate. Masking and etching such oxide layer formed rectangular shaped regions. Such regions were then etched vertically about 10 $\mu$m forming square openings on the top surface about 23 $\mu$m in length. Sides protrude down symmetrically from each opening to a square base having a length of about 9 $\mu$m.

In fabricating trapezoidal shaped blocks, an epi-ready two inch n-type gallium arsenide wafer provided a substrate for the formation of the self-aligning blocks. Native oxide on the top surface of such block was first cleared off by a desorption process. The desorption process included exposing the wafer to a temperature of about 700° C. and elements including arsenic. After the desorption step, a sacrificial layer comprising 1 $\mu$m of doped or undoped aluminum arsenide was grown on and in contact with the top surface. A thickness of about 10.7 $\mu$m of silicon doped gallium arsenide was then grown through an MBE process overlying the aluminum arsenide layer. Silicon dopants were at a concentration of about $10^{18}$ atoms/cm$^3$. The top surface of the MBE grown layer was then patterned with photoresist.

Patterning the top surface of the MBE grown layer included spreading a photoresist layer having a thickness of about 1.6 $\mu$m over the top surface of the MBE grown gallium arsenide layer. The photoresist used is a product made by Shipley under the name of AZ1400-31. Patterning steps also included at least exposing, developing, and baking the photoresist. Such baking step occurred at a temperature of about 120° C. for about 1 hour to hard-bake the photoresist layer. The patterning steps formed a plurality of rectangles each having a dimension of about 35 $\mu$m by 24 $\mu$m (exposed portions of the photoresist) on the top surface.

After patterning, unexposed regions were etched forming trapezoidal shaped blocks attached to the aluminum arsenide sacrificial layer. Proper fit between the block and the recessed region requires each block to have substantially the same shape. Accordingly, various concentrations and techniques of wet etching were tested in this particular example.

Generally, wet etching the unexposed regions produced results which depended upon the orientation of the mask edges. If the mask edges were parallel to the [1$\bar{1}$0] direction, wet etching the unexposed regions created outward sloping profiles from the top surface of each block. Alternatively, wet etching unexposed regions where mask edges were parallel to the [110] direction created inward sloping (or reverse mesa) profiles.

Wet etching produced such different profiles (mesa and reverse mesa) because gallium arsenide includes two distinct sets of {111} planes. In a {111} A or {111} gallium plane, each gallium atom on the surface has three arsenide atoms bonded below. For a {111} B or {111} arsenic plane, each arsenide atom on the surface includes three gallium atoms bonded below. Each arsenide atom in the {111} B layer includes a pair of dangling electrons and is therefore exposed. Such dangling electrons are not present in the structure of the {111} A plane. Accordingly, {111} B planes tend to etch faster than {111} A planes, thereby forming blocks having a reverse mesa shape which is generally incompatible with the recessed regions etched on the silicon substrate.

Mask edges parallel to the [110] plane produced more undercutting than the cases where mask edges were parallel to the [1$\bar{1}$0] plane. In the present example, mask edges parallel to the [110] direction produced about 1.1 $\mu$m of horizontal etching per micron of vertical etching near the tops of the blocks. Regions near the base of the blocks produced etches of about 0.4 $\mu$m of horizontal etching per micron of vertical etching. Alternatively, mask edges parallel to the [1$\bar{1}$0] plane produced etches of about 0.8 $\mu$m of horizontal etching per micron of vertical etching for regions near the top of the blocks, and 0.1 $\mu$m of horizontal etching per micron of vertical etch near the bottom of the blocks. The formation of a square region at the base required a longer mask in the [110] direction.

In addition to mask alignment, etchant concentration also affected the shape of each gallium arsenide block. A solution of phosphoric acid, hydrogen peroxide, and water ($H_2PO_3:H_2O_2:H_2O$) provided a promising etchant for the MBE grown gallium arsenide layer in the present example. Such etchant created three distinct profiles, depending upon the amount of hydrogen peroxide and water added to phosphoric acid. Dilute concentrations of phosphoric acid (1:1:40 $H_2PO_3:H_2O_2:H_2O$) created a trapezoidal or mesa shaped profile having a 30° angle between the top surface of the block and a corresponding side. Etchant solutions which were less concentrated produced shallower trapezoidal or mesa shaped profiles at angles from about 10° to 20°. Such shallower profiles were probably a result of etching reactions being transport limited in the {111} B planes.

Higher concentrations of phosphoric acid (1:1:20 $H_2PO_3:H_2O_2:H_2O$ and above) created inward sloping (or reverse mesa) profiles limited by the reaction of the {111} B planes. Preferably, a phosphoric acid concentration (1:1:30 $H_2PO_4:H_2O_2:H_2O$) between the dilute and concentrated solutions provides better profiles for assembly with recessed regions etched on the silicon substrate. Such etchant produced blocks having angles of 55° parallel to the [110] plane and 49° parallel to the [1$\bar{1}$0] plane, and typically etched the MBE grown layer at a rate of about 0.133 $\mu$m/minute (or about 133 nm/min). In producing the results described, etchant solution was typically replenished when depleted.

Increasing the ratio of phosphoric acid to hydrogen peroxide by 3:1 produced similar profiles to the experiments described, but generally caused rough surfaces on the sides. Such rough surfaces were desirable for the present application.

In a modification to this example, a similar wet etchant (1:1:30 $H_2PO_3:H_2O_2:H_2O$) facilitated the formation of aluminum gallium arsenide blocks from an aluminum gallium arsenide MBE grown layer. Such etchant provided an inward sloping profile parallel to the [110] direction for an aluminum gallium arsenide (x=0.1, $Al_xGa_{1-x}As$) grown MBE layer. Vertical etch rates were about the same as the gallium arsenide MBE grown layer. However, the presence of aluminum arsenide increased etching of the {111} B plane into the reaction-rate limited regime. Such etchant produced an inward sloping profile because etching x=0.1, $Al_xGa_{1-x}As$ was more reactive in the {111} B plane than gallium arsenide.

In addition to wet etching, ion milling was also used to create the gallium arsenide trapezoidal shaped blocks. Ion milling the MBE grown gallium arsenide layer provided outward sloping profiles ranging at angles of about 68° to 90° between the top surface and a corresponding side. To produce such angles, the ion beam angles ranged from about 0° to 25° in reference to a normal from the top surface of the MBE grown layer. Steeper beam angles (closer to 90°) generally created vertical or substantially vertical profiles. Ion milling also required the substrate to be rotated about a center axis during such processing step. Other processing variables included an argon gas etchant, pressure of about 50 millitorr, ion energy of about 1000 v, and an ion milling rate of 1 $\mu$m every seven minutes. As the photoresist mask eroded laterally about 5 $\mu$m every 70 minutes during milling, sidewalls having angles at about 68° were produced. Selectivity between the gallium arsenide and photoresist was about 3:1. Ion milling produced substantially consistent gallium arsenide blocks and was therefore more effective than wet etching in this particular example.

A final bath having a concentration of 1:1:30 $H_2PO_3:H_2O_2:H_2O$ was used to clear off remaining oxides of either gallium arsenide and aluminum arsenide. Such oxides were typically formed when aluminum arsenide was exposed to etching baths or ion milling. Hydrofluoric acid may then be used to clear off the oxide layers (typically rough looking and brown in appearance). Generally, such oxide layers reduce the effectiveness of hydrofluoric acid (HF) etching on the sacrificial aluminum arsenide layer.

After clearing off any oxide layers, a HF solution preferentially etched the sacrificial layer of aluminum arsenide to lift-off the gallium arsenide blocks. In particular, a HF solution having a concentration of about 5:1 $H_2O$:HF was used to etch the sacrificial layer and lift off the blocks. Any blocks still remaining on the substrate possibly through surface tension can be mechanically removed from the substrate into a solution. Removed blocks include a base dimension of about 22 $\mu$m by 23 $\mu$m, compared to a designed dimension of 24 $\mu$m by 24 $\mu$m.

After removing the blocks from the substrate, a teflon pipet was used to remove a substantial portion of the HF solution from the gallium arsenide blocks. Any remaining HF was rinsed off with water. Such rinsing step created a mixture including blocks and water. An inert solution such as acetone then replaced the water to decrease any oxide formation on the blocks. Once in the inert solution, the blocks may cluster together and either float to the surface or settle to the bottom of the solution. Such clusters, often visible to the naked eye, decreased the effectiveness of a subsequent transferring step, and were therefore separated by mechanically agitating the solution with ultrasonic vibration.

The inert solution including gallium arsenide blocks was then transferred (or poured) evenly over the top surface of the silicon substrate. In particular, a pipet was used to transfer such solution over the top surface of the substrate. The solution is transferred at a rate creating substantially a laminar flow. Such laminar flow allowed the blocks to tumble and/or slide onto the top surface of the substrate and then self-align into the recessed regions via the trapezoidal profile. Generally, the transfer rate should provide an even flow of solution including blocks over the substrate surface but should not free or remove any blocks already disposed into the recessed regions.

Blocks fabricated by ion milling produced higher yields than wet etched blocks. Ion milled blocks having substantially consistent profiles self aligned and inserted into more than 90% of the recessed regions located on the substrate surface before the solution substantially evaporated. As the solution evaporates, surface tension often pulled a portion of the blocks out of the recessed regions. About 30% to 70% of the recessed regions remained filled after evaporation. The decrease in yield can be addressed by using liquids having lower surface tension during evaporation or by super critical drying methods which substantially eliminates surface tension. Alternatively, blocks may be bonded into the recessed regions prior to evaporation of the solution, thereby fixing the yield. Wet etched blocks having less consistent block profiles inserted correctly into about 1% to 5% of available recessed regions. Accordingly, ion milled blocks provided higher yields relative to the blocks fabricated by wet etching.

Figure 13:
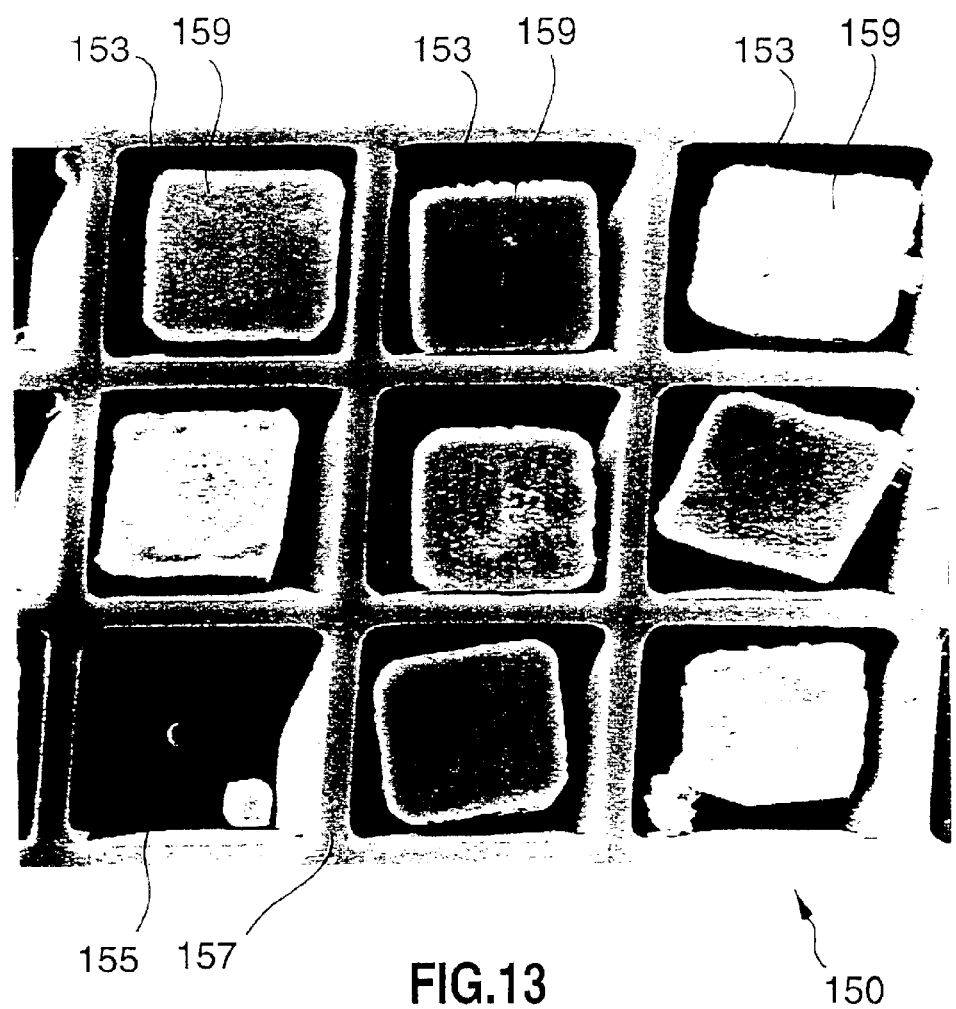
FIG. 13 is a photograph of an assembled microstructure according to the experiment.

Photographs shown in FIG. 13 illustrate gallium arsenide blocks disposed into recessed regions of the silicon substrate 150 according to the present example. A top portion 153 of each recessed region is square and measures about 23 $\mu$m at length. As shown, the photograph includes recessed regions 155, silicon substrate 157, and trapezoidal shaped block 159.

Figure 14:
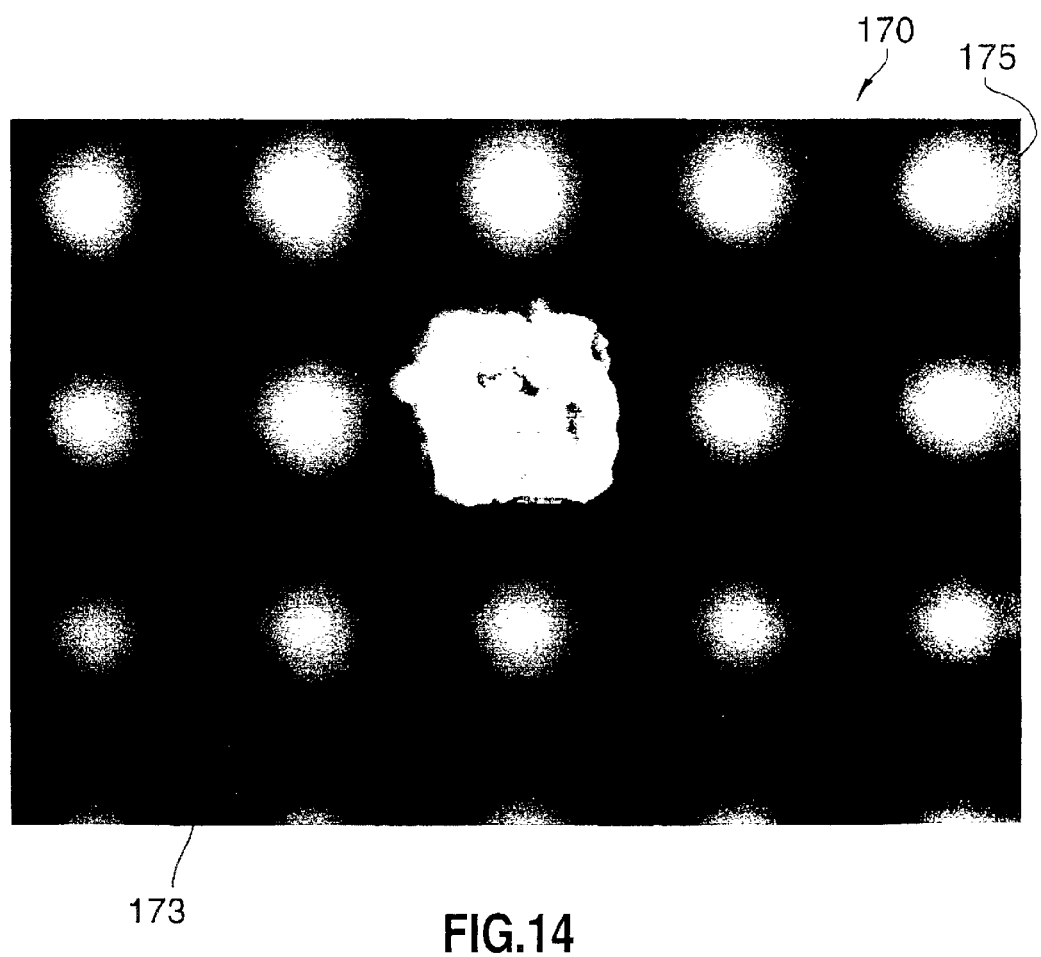
FIG. 14 is a photograph of an operational photo diode according to the experiment.
Figure 15:
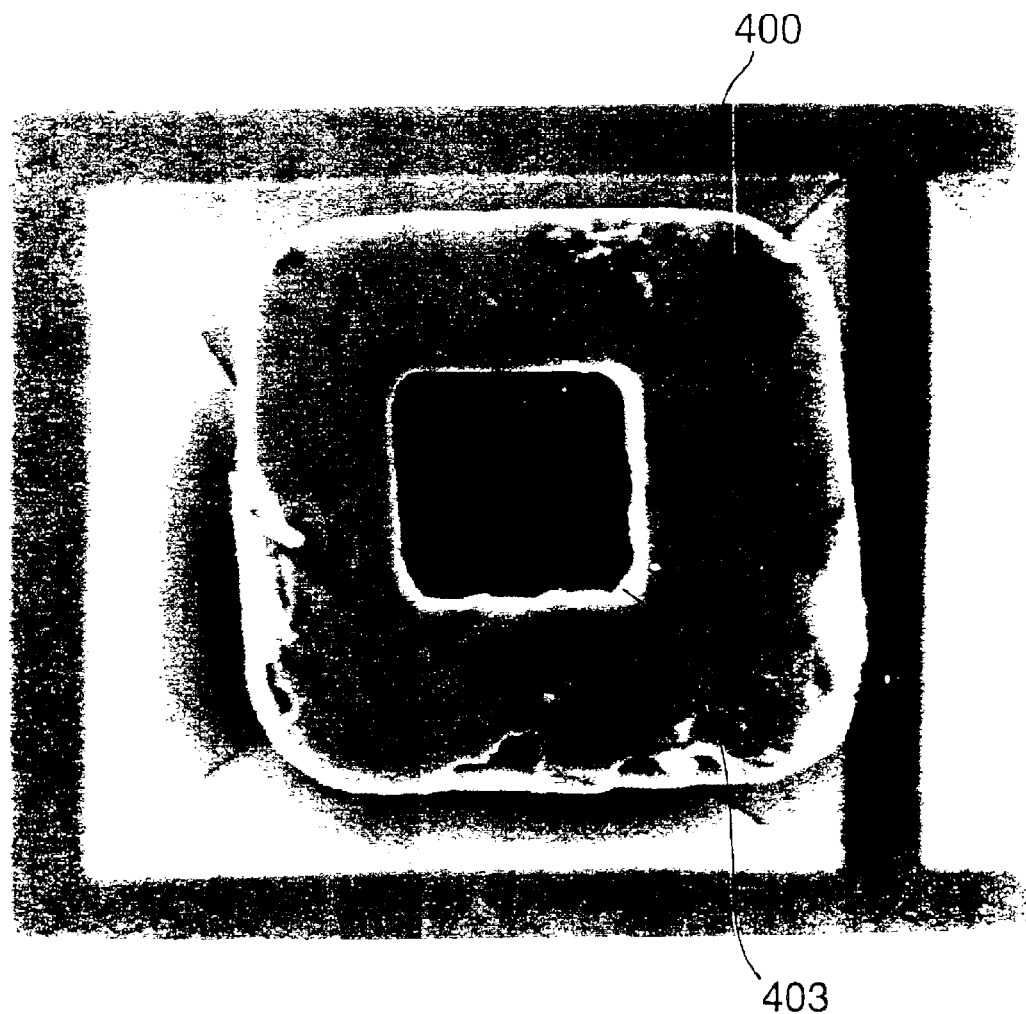
FIG. 15 is a photograph of a metallized ring layer overlying a gallium arsenide block.
Figure 16:
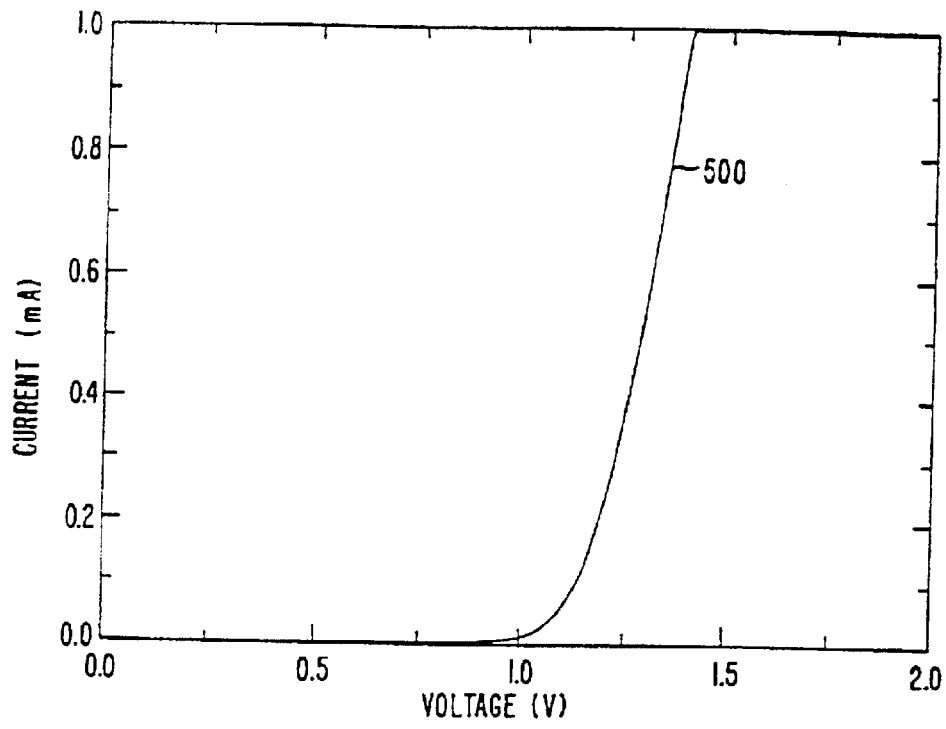
FIG. 16 is a current-voltage representation for a gallium arsenide diode according to the experiment.

To further illustrate the operation of the present example, an illuminated diode 170 is shown in the photograph of FIG. 14. The photograph includes silicon substrate 173 and illuminated gallium arsenide LED 175. The gallium arsenide LED emitted infrared radiation while under electrical bias. Each gallium arsenide LED which was grown on an MBE layer included an N+ gallium arsenide cap layer (about 100 nm thickness), an N+ $Al_{0.1}Ga_{0.9}As$ transport layer (about 1 $\mu$m thickness), a P− active region (about 1 $\mu$m thickness), and a P+ buffer layer (about 1 $\mu$m thickness). The gallium arsenide LED also required a ring metallized contact 400 for applying voltage and an opening 403 for light output at a top portion of each block as illustrated in FIG. 15. A current-voltage (I–V) curve 500 illustrated in FIG. 16 exhibits typical p-n junction characteristics for the gallium arsenide structure of FIG. 14.

Figure 17:
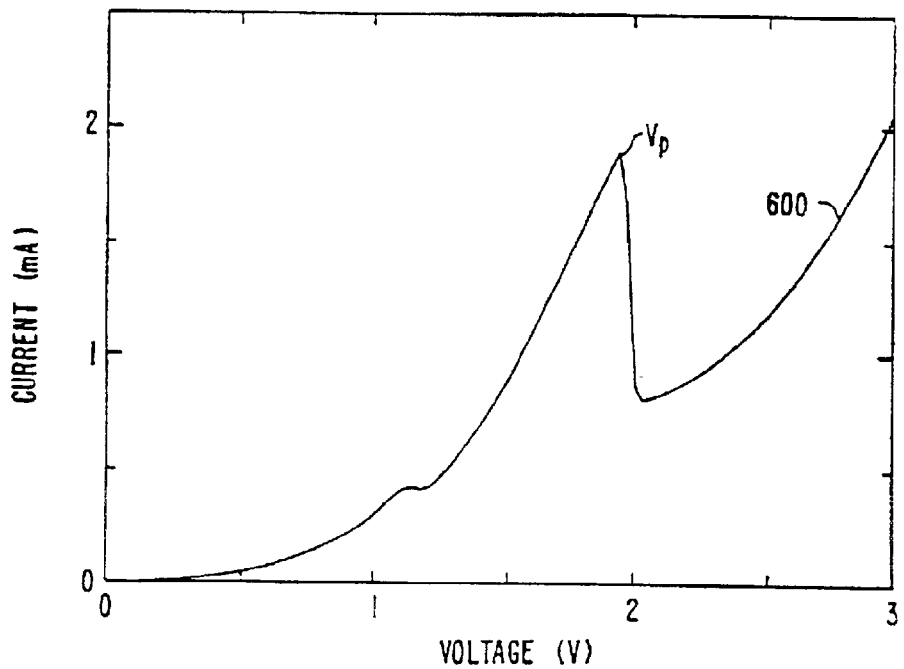
FIG. 17 is a current-voltage representation for a gallium arsenide/aluminum arsenide resonant-tunneling diode according to the experiment.

Gallium arsenide/aluminum arsenide resonant-tunneling diodes (RTD's) were also integrated onto silicon. RTD's grown on an MBE layer include gallium arsenide wells (depth at about 5.0 nm) between two aluminum arsenide barriers (depth at about 2.5 nm). Current-voltage characteristics 600 for the RTD's integrated with silicon exhibited proper differential negative resistance (NDR) at $V_{PEAK}$=2.0 v. as illustrated in FIG. 17. At such voltage, peak-to-valley ratio was about 2.5. Oscillations (rf) observed after biasing the RTD's in the NDR region were limited to about 100 MHz. External capacitances and inductances of the biasing circuit caused such limitations in frequency.

The description above is in terms of assembling a gallium arsenide block onto a silicon substrate for illustrative purposes only. As shown, the invention may be applied to forming gallium arsenide diodes onto silicon substrates. Another commercial application includes gallium arsenide lasers assembled with silicon integrated circuits. The silicon chips can communicate with other chips with integrated optical detectors on extremely high bit-rate optical channels. Other applications may also include integration of microwave gallium arsenide devices onto silicon integrated circuits for the purpose of microwave electronics. Still a further application includes microstructures integral with a plastic sheet forming active liquid crystal displays (ALCD) and the like. In such application, the plastic sheet may be fabricated by a technique including stamping, injection molding, among others. Advantages of the invention include for example the applicability of conventional metallization or other processes over the planar surface for interconnection of the integrated electronic devices or portions of electronic devices between the blocks and/or between blocks and other electronic devices on the substrate. The concept of the invention can be used with almost any type of microstructure which assembles onto a larger substrate.

To demonstrate the general operation and effectiveness of the method and apparatus for various applications such as those requiring different sizes of shaped blocks, further examples of the invention involved assembling microstructures on a silicon substrate using shaped trapezoidal blocks of silicon having two different sizes and differing by 2.5 orders of magnitude in mass.

In the first silicon experiment, larger trapezoidal blocks were designed to have two-fold rotational symmetry with the size of the larger face having a dimension of about 1.0 mm×1.2 mm and a depth of about 235 $\mu$m, and recessed regions were designed to correspond to the dimensions of the larger trapezoidal blocks. In the second silicon experiment, smaller trapezoidal blocks were designed to have four-fold symmetry with the size of the larger face having a dimension of about 150 $\mu$m×150 $\mu$m and a depth of about 35 $\mu$m, and recessed regions were designed to correspond to the dimensions of the smaller trapezoidal blocks. In both experiments, the method and apparatus exhibited high fill-factors.

In each of the silicon examples, the mixture or slurry including silicon shaped blocks and an inert fluid are transported over a top surface of a silicon substrate having complementary recessed regions by use of an apparatus that circulates the slurry over the substrate.

In creating silicon substrates having recessed regions for each silicon experiment, a solution of potassium hydroxide (KOH) produced recessed regions having a trapezoidal profile or inverted truncated pyramid shape. The solution created trapezoidal shaped profiles or inverted truncated pyramid shapes having a larger face with lateral dimensions at the top surface with sides sloping inward at about 55° from the top surface of the substrate. Trapezoidal profiles occurred due to the selectivity (1:200) between the {111} plane and the {100} plane. Specifically, the {111} plane etched slower than the {100} plane by the approximate ratio of 1:200.

In the silicon examples, the KOH solution etched trapezoidal recessed regions into about 500 $\mu$m thick silicon wafers (5 cm×5 cm in overall area) using a mask consisting of rectangular openings. The KOH etchant solution used in the examples was a 1:2 (by weight) KOH:$H_2O$ solution at about 80° C. Prior to the etching step, a silicon nitride ($SiN_x$) mask layer was first formed on a top surface of such substrates.

Masking and etching such silicon nitride layer formed trapezoidal shaped recessed regions. The depth of the trapezoidal recessed region is determined by the length of time the silicon substrate is etched. If the silicon is etched the correct length of time, recessed regions can be made which are identical in shape and size to the blocks.

For the first silicon experiment, the larger recessed regions in the substrate had lateral dimensions of about 1.0 mm×1.2 mm at the top surface and a depth of about 235 $\mu$m after about 23 minutes of etching to complement the larger trapezoidal shaped blocks. In total, the mask in this experiment consisted of 191 holes corresponding to recessed regions, arranged in various test patterns.

For the second silicon experiment, the smaller recessed regions in another substrate had lateral dimensions of about 150 $\mu$m×150 $\mu$m at the top surface and a depth of about 35 $\mu$m after about 30 minutes of etching to complement the smaller trapezoidal shaped blocks. The mask in this experiment was simply an array of 64×64 holes (corresponding to 4,096 recessed regions) with about a 300 $\mu$m spacing between consecutive holes.

In the substrates for both silicon experiments, the silicon nitride mask layer was not removed from the substrates and remained on the substrates throughout the microstructure assembling method.

In fabricating the larger trapezoidal shaped blocks for the first silicon experiment, a single-side-polished two inch silicon wafer of about 235 $\mu$m thickness provided a substrate for the formation of self-aligning shaped blocks. In this experiment, the silicon wafer itself is the block layer from which the trapezoidal shaped blocks are formed. A $SiN_x$ layer of thickness about 0.4 $\mu$m was deposited on both the polished bottom surface of the wafer and the unpolished upper surface of the wafer. The $SiN_x$ layer overlying the unpolished upper surface of the wafer forms a sacrificial layer, and the $SiN_x$ layer overlying the polished bottom surface of the wafer forms a mask layer. The $SiN_x$ mask layer overlying the polished bottom surface of the wafer was then patterned with photoresist.

Patterning the $SiN_x$ mask layer overlying the polished bottom surface of the wafer included spreading a photoresist layer over this $SiN_x$ layer. Patterning steps also included at least exposing, developing, and baking the photoresist. Such baking step occurred at a temperature of about 120° C. for about 20 minutes to hard-bake the photoresist layer. The patterning steps formed a plurality of squares (or rectangles). After patterning, exposed regions were etched forming trapezoidal shaped blocks attached to the $SiN_x$ sacrificial layer.

In fabricating smaller trapezoidal shaped blocks for the second silicon experiment, a SOI wafer provided a substrate for the formation of self-aligning shaped blocks. The particular SOI wafer used had a SOI layer of about 35 $\mu$m thickness with a silicon dioxide ($SiO_2$) layer of about 0.4 $\mu$m thickness separating it from the rest of the wafer. The 35 $\mu$m SOI layer is the block layer of silicon from which the trapezoidal shaped blocks are formed. The $SiO_2$ layer of about 0.4 $\mu$m thickness is the sacrificial layer. A $SiN_x$ mask layer of thickness about 0.4 $\mu$m was deposited on both 35 $\mu$m silicon block layer and patterned with photoresist.

Patterning the $SiN_x$ mask layer overlying the upper surface of the wafer included spreading a photoresist layer over this $SiN_x$ mask layer. Patterning steps also included at least exposing, developing, and baking the photoresist. The patterning steps formed a plurality of rectangles each having a dimension of about 150 $\mu$m×150 $\mu$m (exposed portions of the photoresist). After patterning, unexposed regions were etched forming trapezoidal shaped blocks attached to the $SiO_2$ sacrificial layer.

The slowest etching planes for silicon in this KOH:$H_2O$ etching solution are the {111} planes, which can be considered etch stops forming the sloping sides of the shaped blocks. In each silicon experiment, the respective mask used to define the blocks must be aligned to the appropriate crystal axis. As shown in FIG. 20, a mask was used to form silicon trapezoidal shaped blocks. Trapezoidal shaped block is formed at the intersection of the diagonal lines on the mask. The width of the diagonal lines in the figure must be twice the thickness of the silicon block layer. For the larger trapezoidal blocks, a=0.2 mm and t=235 $\mu$m; whereas, for the smaller trapezoidal blocks, a=0 and t=35 $\mu$m.

Etching is completed when this silicon block layer is etched entirely through, and simultaneously when the corners are precisely formed. Continuing etching beyond this point does not change the overall dimensions of the trapezoidal shaped block, but merely rounds the corners. Because of geometric considerations, the width of the top face of the shaped block must be at least 3√2 times the thickness of the silicon block layer. This limits the aspect ratio of the blocks fabricated by this technique. This mask pattern utilizes as high as 50% of the silicon area if there is no distance between block corners.

In the first silicon experiment with the larger shaped blocks, the etched silicon wafer is placed in concentrated HF etch solution to remove the shaped blocks from contact with the $SiN_x$ sacrificial layer and any remaining $SiN_x$ from the mask layer. In the second silicon experiment with the smaller shaped blocks, the etched SOI wafer similarly is placed in concentrated HF etch solution to remove the shaped blocks from contact with the $SiO_2$ sacrificial layer and any remaining $SiN_x$ from the mask layer. This HF etch solution preferentially etches the $SiO_2$ and the $SiN_x$ to free the shaped blocks without etching the silicon shaped blocks. In particular, a HF solution having a concentration of about 1:1 HF:$H_2O$ was used to etch the sacrificial layer and residual $SiN_x$ to free the shaped blocks.

Once all the shaped blocks were free in the solution, the HF was decanted and water was added. For the first silicon experiment, water and the larger shaped blocks formed the mixture or slurry. However, for the second silicon experiment, methanol and the smaller shaped blocks formed the mixture or slurry. As silicon is hydrophobic in nature, smaller shaped blocks having smaller mass tended to float on the surface of the water. The larger blocks did not have this problem because of their larger mass. Since methanol has both polar and nonpolar properties, the smaller shaped blocks did not float but preferably submerged into the fluid. As the silicon examples demonstrate, the selection of the fluid used in the slurry may depend on the mass of the shaped block, among other factors.

In the first silicon experiment, the mixture including approximately 500 of the larger shaped blocks and water (about 0.5 liter) was placed into the apparatus (about 4" diameter). The substrate was about 5 cm×5 cm and contained 191 recessed regions in various patterns. Initially, small bubbles tended to stick to the larger shaped blocks and to the recessed regions on the substrate, due to the fact that all the silicon surfaces are hydrophobic. Adding a small amount of surfactant of about 5 drops to the water (1:100,000) made the silicon surfaces less hydrophobic and bubbles no longer stuck to the shaped blocks or to the recessed regions. The substrate was oriented at an angle which caused the incorrectly oriented blocks to slide off. Agitation and correct orientation of the substrate increased the rate at which the blocks filled the holes. Because of the tapered shape of the trapezoidal blocks, nearly all the blocks descended through the fluid with the larger surface facing upward. Upon landing on the substrate, the blocks were thus properly oriented to fill the recessed regions, resulting in enhanced fill rates. On repeated runs of this first silicon experiment, all 191 recessed regions were filled for a fill-factor of 100% in about 4.5 minutes.

In the second silicon experiment, the mixture including approximately 30,000 of the smaller shaped blocks and methanol (about 0.5 liter) was placed into the apparatus. The substrate was about 5 cm×5 cm and contained a 3 cm×3 cm array of 64×64 (4,096) recessed regions in the center of the substrate. Operating the apparatus in a manner similar to that used for the first silicon experiment with the larger shaped blocks resulted in a saturated fill-factor of about 70% after about 15 minutes.

When the larger faces of the shaped blocks are rough, higher fill-factors were achieved. For shaped blocks having smooth larger faces, the shaped blocks tended to stick to the smooth surface of the substrate and reduce the overall motion of the blocks on the substrate, with the fluid flow being insufficient to free blocks stuck in this manner. In the first silicon experiment, the larger shaped blocks did not have this problem since the larger face of the blocks was the rough back of the unpolished wafer. Shaped blocks having features, such as circuits or contact pads, on the larger face have such rough surfaces for higher fill-factors.

Roughening the top surface of the substrate having the recessed regions also leads to higher fill-factors. After removing the $SiN_x$ mask layer, the substrate was lapped in about 0.5 $\mu$m $Al_2O_3$ lapping powder just long enough (about 1–2 minutes) to create about a 0.3 $\mu$m roughness on the surface. Blocks in all orientations easily came off the substrate after it was roughened. Using a lapped substrate in the second silicon experiment with smaller shaped blocks, saturated fill-factors of about 90% were achieved after about 15 minutes in the apparatus. After repeated runs of the second silicon experiment, it was determined that the 90% fill-factor achieved for the smaller blocks was a steady state condition.

In order to achieve even higher fill-factors, especially for the smaller shaped blocks, care must be taken to properly etch the substrate and to keep the substrate and solution free of particles that could interfere with filling. For example, interference with filling could occur if the bottoms of the recessed regions are left rough by the KOH etching, or if particulates are deposited inside the recessed regions during the lapping process. Nonuniformity in the bottoms of the recessed regions could either prevent blocks from entering the recessed regions, or aid in the unfilling of the blocks from these recessed regions. Additionally, substrates with recessed regions that were not etched deep enough did not achieve high fill-factors, since the blocks protruding above the edge of the recessed region in the substrate could more easily be removed by fluid flow. Substrates with recessed regions that were etched too deeply also did not achieve high fill-factors. While the lateral dimensions at the top of an overetched recessed region remain the same, the lateral dimensions at the bottom of the recessed region become smaller as the depth is increased. Therefore, only the edges and not the smaller bottom face of a block filling an overetched recessed region will touch the substrate. Optimally, higher fill-factors are achieved when the recessed regions are neither underetched nor overetched.

Also described in general terms is the unique profiles for creating self-assembling devices. Such unique profiles, for example, are terms of a single block structure having a corresponding recessed region structure on a substrate for illustrative purposes only. The block structure may also include a variety of shapes such as a cylindrical shape, rectangular shape, square shape, hexagonal shape, pyramid shape, T-shape, kidney shape, and others. The block structure includes widths, lengths, and heights to promote self-assembly for a desired orientation. In addition, more than one type of structure may be present in the mixture (solution and blocks) as long as each structure includes a specific binding site on the substrate.

Although the foregoing invention has been described in some detail by way of illustration and example, for purposes of clarity of understanding, it will be obvious that certain changes and modifications may be practiced within the scope of the appended claims.

The above description is illustrative and not restrictive. Many variations of the invention will become apparent to those of skill in the art upon review of this disclosure. Merely by way of example the invention may used to assemble gallium arsenide devices onto a silicon substrate as well as other applications. The scope of the invention should, therefore, be determined not with reference to the above description, but instead should be determined with reference to the appended claims along with their full scope of equivalents.

What is claimed is:

1. A structure comprising an assemblage of separate electronic devices, each electronic device having a first surface and a second surface substantially parallel to said first surface, said electronic device further having a beveled side connecting said first surface to said second surface, said first surface having a smaller area than said second surface, said electronic device further having electronic structures formed on said second surface.

2. The structure of claim 1 wherein said electronic device has a length dimension of about 50 microns or less.

3. The structure of claim 1 wherein said electronic device has a trapezoidal cross-section.

4. The structure of claim 1 wherein said side surfaces are etched surfaces.

5. The structure of claim 1 wherein said electronic device is a multilayered structure.

6. The structure of claim 5 wherein said multilayered structure includes a metal layer.

7. The structure of claim 5 wherein said multilayered structure includes an insulator layer.

8. The structure of claim 5 wherein said multilayered structure includes a layer of silicon dioxide.

9. The structure of claim 5 wherein said multilayered structure includes a layer of silicon nitride.

10. The structure of claim 1 wherein said electronic device comprises material is selected from the group consisting of silicon, gallium arsenide, aluminum gallium arsenide, diamond, and germanium.

11. The structure of claim 1 wherein said electronic device comprises a group III–V compound.

12. The structure of claim 1 wherein the perimeter of said first surface has a rectangular shape, an octagonal shape, or a circular shape.

13. The structure of claim 1 wherein said electronic device has a length dimension of about 1 mm or less.

14. The structure of claim 1 wherein said electronic device has a length dimension of about 500 microns or less.

15. The structure of claim 1 wherein said electronic device has an edge portion that is beveled.

16. The structure of claim 1 wherein said electronic device is shaped like a truncated pyramid.

17. A shaped block of material adapted for being received in a recess of a substrate, said shaped block of material having sloped sides and a top surface connected to a bottom surface by said sloped sides, said top surface being substantially parallel to said bottom surface, said top surface being non-congruent with said bottom surface, a larger of said top surface and bottom surface having formed thereon an electronic device.

18. The shaped block of claim 17 wherein said block of material has a length measurement less than or equal to 50 microns.

19. The shaped block of claim 17 wherein said sloped sides are etched sides.

20. The shaped block of claim 17 wherein said sloped sides have a slope between about 40° and 60° relative to a line normal to said top surface.

21. The shaped block of claim 17 wherein said material comprises a multilayered structure.

22. The shaped block of claim 17 wherein said material is selected from the group consisting of silicon, gallium arsenide, aluminum gallium arsenide, diamond, and germanium.

23. The shaped block of claim 17 wherein said material comprises a group III–V compound.

24. The shaped block of claim 17 wherein the perimeter of said first surface has a rectangular shape, an octagonal shape, or a circular shape.

25. The shaped block of claim 17 wherein said block of material has a length measurement less than or equal to 500 microns.

26. The shaped block of claim 17 wherein said block of material has a length measurement less than or equal to 1 mm.

27. The shaped block of claim 17 wherein said sloped sides have a trapezoidal profile.

28. The shaped block of claim 17 wherein said sloped sides define a portion of a beveled edge.

29. The shaped block of claim 17 wherein said shaped block has a shape of a truncated pyramid.

30. A shaped functional block comprising a semiconductor material and having a shape adapted for self-alignment within a shaped recess formed through a substrate surface, said block having a first surface and a second surface and having etched sides which are sloped such that said block fits into said shaped opening only in an orientation where said first surface is exposed through said substrate surface, said first surface connected to said second surface only by said etched sides, said first surface being larger in area than said second surface and having electronic structures formed thereon.

31. The functional block of claim 30 wherein said first surface includes a conductive contact disposed thereon.

32. The functional block of claim 30 wherein said first surface has an area smaller than said second surface.

33. The functional block of claim 32 wherein said first surface has a circular perimeter, a rectilinear perimeter, or an octagonal perimeter.

34. The functional block of claim 30 having a maximum length dimension of about 1 mm or less.

35. The functional block of claim 30 further comprising a multilayered structure.

36. The functional block of claim 35 wherein said multilayered structure includes a metal layer.

37. The functional block of claim 35 wherein said multilayered structure includes an insulator layer.

38. The functional block of claim 35 wherein said multilayered structure includes a layer of silicon dioxide.

39. The functional block of claim 35 wherein said multilayered structure includes a layer of silicon nitride.

40. The functional block of claim 30 being a light-emitting diode.

41. The functional block of claim 30 having a maximum length dimension of about 500 micron or less.

42. The functional block of claim 30 having a maximum length dimension of about 50 micron or less.

43. The functional block of claim 30 wherein said etched sides are characterized by having a trapezoidal profile.

44. The functional block of claim 30 wherein said etched sides form a beveled edge adjacent said first surface.

45. The functional block of claim 30 having a shape of a truncated pyramid.

46. A semiconductor microstructure comprising a shaped block having a first surface substantially parallel to a second surface, said first surface having an associated first area, said second surface having an associated second area, said first area being larger than said second area, an edge that is adjacent both said first surface and said second surface being sloped, said first surface having formed thereon electronic structures, said block having a maximum length dimension of about 1 mm or less in measure.

47. The semiconductor microstructure of claim 46 wherein said shaped block comprises material selected from the group consisting of silicon, gallium arsenide, aluminum gallium arsenide, diamond, and germanium.

48. The semiconductor microstructure of claim 46 wherein said shaped block comprises a group III–V compound.

49. The semiconductor microstructure of claim 46 wherein said shaped block is a multilayered structure.

50. The semiconductor microstructure of claim 49 wherein said multilayered structure constitutes a light-emitting diode.

51. The semiconductor microstructure of claim 50 wherein said multilayered structure includes gallium arsenide.

52. The semiconductor microstructure of claim 46 wherein said length dimension further is about 500 microns or less in measure.

53. The semiconductor microstructure of claim 52 wherein said length dimension further is about 50 microns or less in measure.

54. The semiconductor microstructure of claim 46 wherein said edge has a trapezoidal profile.

55. The semiconductor microstructure of claim 46 wherein said edge is beveled.

56. The semiconductor microstructure of claim 46 wherein said shaped block has a truncated pyramid appearance.

57. A portion of an integrated circuit device comprising a shaped functional block, said functional block comprising a semiconductor material and having a length dimension less than or equal to 1 mm in measure, said functional block having a top surface, a bottom surface that is smaller than said top surface, and etched sides that connect said top surface with said bottom surface, said top surface having formed thereon an electronic device.

58. The portion of an integrated circuit device of claim 57 wherein said semiconductor material is a multilayered structure.

59. The portion of an integrated circuit device of claim 57 wherein said semiconductor material is selected from the group consisting of silicon, gallium arsenide, aluminum gallium arsenide, diamond, and germanium.

60. The portion of an integrated circuit device of claim 57 wherein said semiconductor material is a group III–V compound.

61. The portion of an integrated circuit device of claim 57 wherein said semiconductor material constitutes a light-emitting diode.

62. The portion of an integrated circuit device of claim 61 wherein said light-emitting diode is a gallium arsenide light-emitting diode.

63. The portion of an integrated circuit device of claim 57 wherein said length dimension further is less than or equal to 500 microns in measure.

64. The portion of an integrated circuit device of claim 63 wherein said length dimension further is less than or equal to 50 microns in measure.

65. The portion of an integrated circuit device of claim 57 wherein said etched sides have a form a trapezoidal profile.

66. The portion of an integrated circuit device of claim 57 wherein said functional block further comprises a first major surface and a second major surface connected to said first major surface by said etched sides, a portion of said etched sides adjacent to said first major surface forming a beveled edge.

67. The portion of an integrated circuit device of claim 57 wherein said functional block has a shape of a truncated pyramid.

68. An electronic chip comprising a shaped block of material separated from a substrate and having a first surface and a second surface substantially parallel to said first surface, said block further having etched side surfaces extending from said first surface to said second surface, said first surface having an a real measurement larger than an a real measurement of said second surface, said first surface having a conductive contact disposed thereon, wherein said material is semiconductor material.

69. The electronic chip of claim 68 wherein said block of material has a width of about 50 microns or less and a length of about 50 microns or less.

70. The electronic chip of claim 68 wherein said etched side surfaces have a slope relative to a line normal to said first surface between about 40° and 60°.

71. The electronic chip of claim 68 wherein said material comprises a multilayered structure including one or more layers of semiconductor material.

72. The electronic chip of claim 71 wherein said multilayered structure includes a p-type gallium arsenide layer, an n-type gallium arsenide layer, and a eutectic layer.

73. The electronic chip of claim 68 wherein said electronic chip is a light-emitting diode.

74. The electronic chip of claim 68 wherein said electronic chip is a gallium arsenide resonant tunneling diode.

75. The electronic chip of claim 68 wherein said electronic chip is a gallium arsenide diode.

76. The electronic chip of claim 68 wherein said electronic chip is a gallium arsenide microwave device.

77. The electronic chip of claim 68 wherein a cross-section thereof shows one of a cylindrical shape, a rectangular shape, a square shape, a hexagonal shape, a T-shape, and a kidney shape.

78. The electronic chip of claim 68 wherein said block of material has a width of about 1 mm or less and a length of about 1 mm or less.

79. The electronic chip of claim 68 wherein said block of material has a width of about 500 microns or less and a length of about 500 microns or less.

80. The electronic chip of claim 68 wherein said shaped block has an outwardly sloped profile.

81. The electronic chip of claim 68 wherein said shaped block has an inwardly sloped profile.

82. The electronic chip of claim 68 wherein a profile of said shaped block resembles a trapezoid.

83. The electronic chip of claim 68 wherein said etched side surfaces define a beveled edge adjacent said first surface.

84. The electronic chip of claim 68 wherein said shaped block is one of a pyramid shape and a truncated pyramid shape.

85. An electronic chip comprising a shaped functional block including a semiconductor material, said functional block having tapered sides connecting a top surface to a bottom surface smaller than said top surface, said top surface having formed thereon at least one electronic device, said functional block further having a length measurement less than or equal to 1 mm, a perimeter of said top surface having a rectilinear shape, a circular shape, or an octagonal shape.

86. The electronic chip of claim 85 wherein said top surface is substantially parallel to said bottom surface.

87. The electronic chip of claim 85 further including a conductive contact disposed atop either or both said top surface and said bottom surface.

88. The electronic chip of claim 85 wherein said semiconductor material is a multilayered structure.

89. The electronic chip of claim 88 wherein said multilayered structure constitutes a light-emitting diode.

90. The electronic chip of claim 85 wherein said length measurement further is less than or equal to 500 microns.

91. The electronic chip of claim 90 wherein said length measurement further is less than or equal to 50 microns.

92. The electronic chip of claim 85 wherein said tapered sides define at least a beveled edge adjacent said top surface.

93. An electronic component separated from a first substrate comprising:

a first surface;

a conductive contact disposed atop said first surface;

a second surface in substantially parallel relation to said first surface and having a smaller area than said first surface; and etched surfaces connecting said first surface to said second surface, said etched surfaces being tapered to define at least a beveled edge adjacent both said first surface and said second surface, wherein said electronic component has a maximum length measurement of about 50 microns or less.

wherein said electronic component is adapted for self-alignment within a shaped opening through a surface of a second substrate.

94. The electronic component of claim 93 wherein said etched surfaces are formed by a wet etch process.

95. The electronic component of claim 93 wherein said etched surfaces are formed by a mask edge.

96. The electronic component of claim 93 wherein said etched surfaces are formed by a reactive ion etch process.

97. The electronic component of claim 93 wherein said etched surfaces are formed by an ion milling process.

98. The electronic component of claim 93 being a light-emitting diode.

99. The electronic component of claim 93 further having a maximum length measurement of about 1 mm or less.

100. The electronic component of claim 93 further having a maximum length measurement of about 500 microns or less.

101. A light-emitting diode (LED) comprising a shaped semiconductor block having tapered sides, said semiconductor block comprising a first surface and a second surface in substantially parallel relation to said first surface, said tapered sides defining at least a beveled edge adjacent both said first and second surfaces, said first surface larger in area than said second surface, said first surface having formed thereon electronic structure for producing light.

102. The LED of claim 101 wherein said semiconductor block has a length dimension less than or equal to 50 microns in measure.

103. The LED of claim 101 wherein said tapered sides are etched sides.

104. The LED of claim 101 incorporated in an active display.

105. The LED of claim 101 wherein said semiconductor block is a multilayered structure.

106. The LED of claim 105 wherein said multilayered structure includes gallium arsenide.

107. The LED of claim 105 wherein said multilayered structure includes a group III–V compound.

108. The LED of claim 101 wherein said semiconductor block has a length dimension less than or equal to 1 mm in measure.

109. The LED of claim 101 wherein said semiconductor block has a length dimension less than or equal to 500 microns in measure.

110. A light-emitting diode (LED) comprising an amount of semiconductor material, said semiconductor material having a first surface and a second surface smaller than said first surface, said semiconductor material having non-parallel side surfaces connecting said first surface to said second surface, said LED having a length dimension less than or equal to 1 mm, said first surface having formed thereon electronic structures configured to produce light.

111. The LED of claim 110 wherein said first surface is in substantially parallel relation to said second surface.

112. The LED of claim 110 wherein said semiconductor material includes a group III–V compound.

113. The LED of claim 112 wherein said semiconductor material includes gallium arsenide.

114. The LED of claim 110 wherein the perimeter of said first surface a rectangular shape, an octagonal shape, or a circular shape.

115. The LED of claim 110 wherein said length dimension further is less than or equal to 500 microns.

116. The LED of claim 115 wherein said length dimension further is less than or equal to 50 microns.

117. The LED of claim 110 further comprising a beveled edge formed adjacent one of said first and second surfaces.

118. A light-emitting diode (LED) comprising a block of semiconductor material including gallium arsenide, said block having a top surface and a bottom surface smaller in area than said top surface and connected to said top surface by sloped surfaces, said block having a length measurement of about 1 mm or less, said top surface having electronic layers formed thereon to produce light.

119. The LED of claim 118 wherein said sloped surfaces are etched surfaces.

120. The LED of claim 119 wherein said etched surfaces are formed by a wet etch process.

121. The LED of claim 119 wherein said etched surfaces are formed by a mask edge.

122. The LED of claim 119 wherein said etched surfaces are formed by a reactive ion etch process.

123. The LED of claim 119 wherein said etched surfaces are formed by an ion milling process.

124. The LED of claim 119 wherein said sloped surfaces define beveled edge adjacent one of said top and bottom surfaces.

125. The LED of claim 118 wherein the perimeter of said top surface has a rectangular shape, an octagonal shape, or a circular shape.

126. The LED of claim 118 wherein said length measurement further is about 500 microns or less.

127. The LED of claim 126 wherein said length measurement further is about 50 microns or less.

128. A shaped block of semiconductor material having tapered sides, said block of material comprising a first surface and a second surface in substantially parallel relation to said first surface and smaller in area than said first surface, said tapered sides defining a beveled edge adjacent both of said first and second surfaces, said first surface having formed thereon an electronic device.

129. The shaped block of claim 128 having a maximum length dimension less than or equal to 1 mm in measure.

130. The shaped block of claim 128 having a maximum length dimension less than or equal to 500 microns in measure.

131. The shaped block of claim 128 having a maximum length dimension less than or equal to 50 microns in measure.

* * * * *